United States Patent
Marinov

(10) Patent No.: US 12,482,679 B2
(45) Date of Patent: Nov. 25, 2025

(54) METHODS OF TRANSFERRING A DIE FROM A CARRIER TO A RECEIVE SUBSTRATE, AND RELATED SYSTEMS AND MATERIALS

(71) Applicant: Kulicke & Soffa Netherlands B.V., Eindhoven (NL)

(72) Inventor: Val R. Marinov, Fargo, ND (US)

(73) Assignee: Kulicke and Soffa Industries, Inc., Fort Washington, PA (US)

( * ) Notice: Subject to any disclaimer, the term of this patent is extended or adjusted under 35 U.S.C. 154(b) by 549 days.

(21) Appl. No.: 17/949,907

(22) Filed: Sep. 21, 2022

(65) Prior Publication Data

US 2023/0107245 A1    Apr. 6, 2023

Related U.S. Application Data

(60) Provisional application No. 63/251,437, filed on Oct. 1, 2021.

(51) Int. Cl.
*H01L 21/67* (2006.01)
*H01L 21/683* (2006.01)
*H01L 23/00* (2006.01)

(52) U.S. Cl.
CPC .... *H01L 21/67144* (2013.01); *H01L 21/6836* (2013.01); *H01L 24/83* (2013.01); *H01L 2224/83234* (2013.01)

(58) Field of Classification Search
CPC .......... H01L 21/67144; H01L 21/6836; H01L 24/83
See application file for complete search history.

(56) References Cited

U.S. PATENT DOCUMENTS

| | | | |
|---|---|---|---|
| 4,535,219 A * | 8/1985 | Sliwa, Jr. ............. | B23K 26/244 361/813 |
| 9,862,141 B2 | 1/2018 | Marinov et al. | |
| 10,748,802 B2 | 8/2020 | Marinov et al. | |
| 11,201,077 B2 | 12/2021 | Marinov et al. | |
| 2020/0168498 A1* | 5/2020 | Marinov ........... | B23K 26/0673 |
| 2022/0130694 A1 | 4/2022 | Marinov et al. | |
| 2022/0236557 A1 | 7/2022 | Semler et al. | |
| 2022/0238366 A1 | 7/2022 | Semler et al. | |

FOREIGN PATENT DOCUMENTS

| | | |
|---|---|---|
| CN | 113327883 | 12/2021 |
| WO | 2020196225 | 10/2020 |
| WO | 2021126580 | 6/2021 |

OTHER PUBLICATIONS

International Search Report for PCT application No. PCT/EP2022/07875 completed on Jan. 18, 2023.

* cited by examiner

*Primary Examiner* — Victor A Mandala
*Assistant Examiner* — Colleen E Snow
(74) *Attorney, Agent, or Firm* — Christopher M. Spletzer, Sr.

(57) ABSTRACT

A method of transferring a die from a carrier to a receive substrate is provided. The method includes the steps of: (a) supporting a die on a carrier, a transfer material being provided between the die and the carrier; (b) exposing the transfer material to light energy to form a bubble in the transfer material; and (c) transferring the die from the carrier to a receive substrate using the bubble, the die being in contact with the bubble when the die contacts the receive substrate.

23 Claims, 26 Drawing Sheets

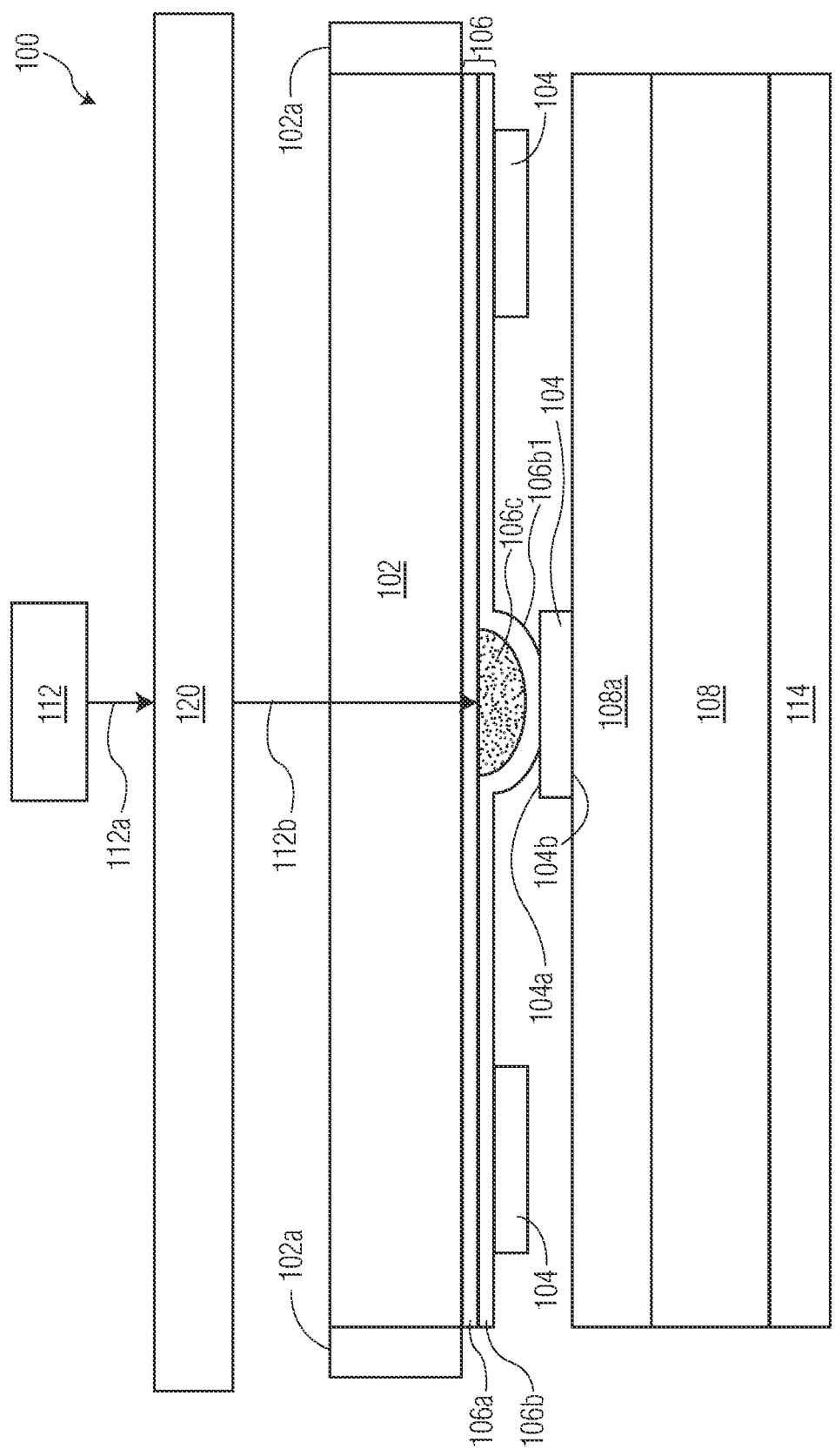

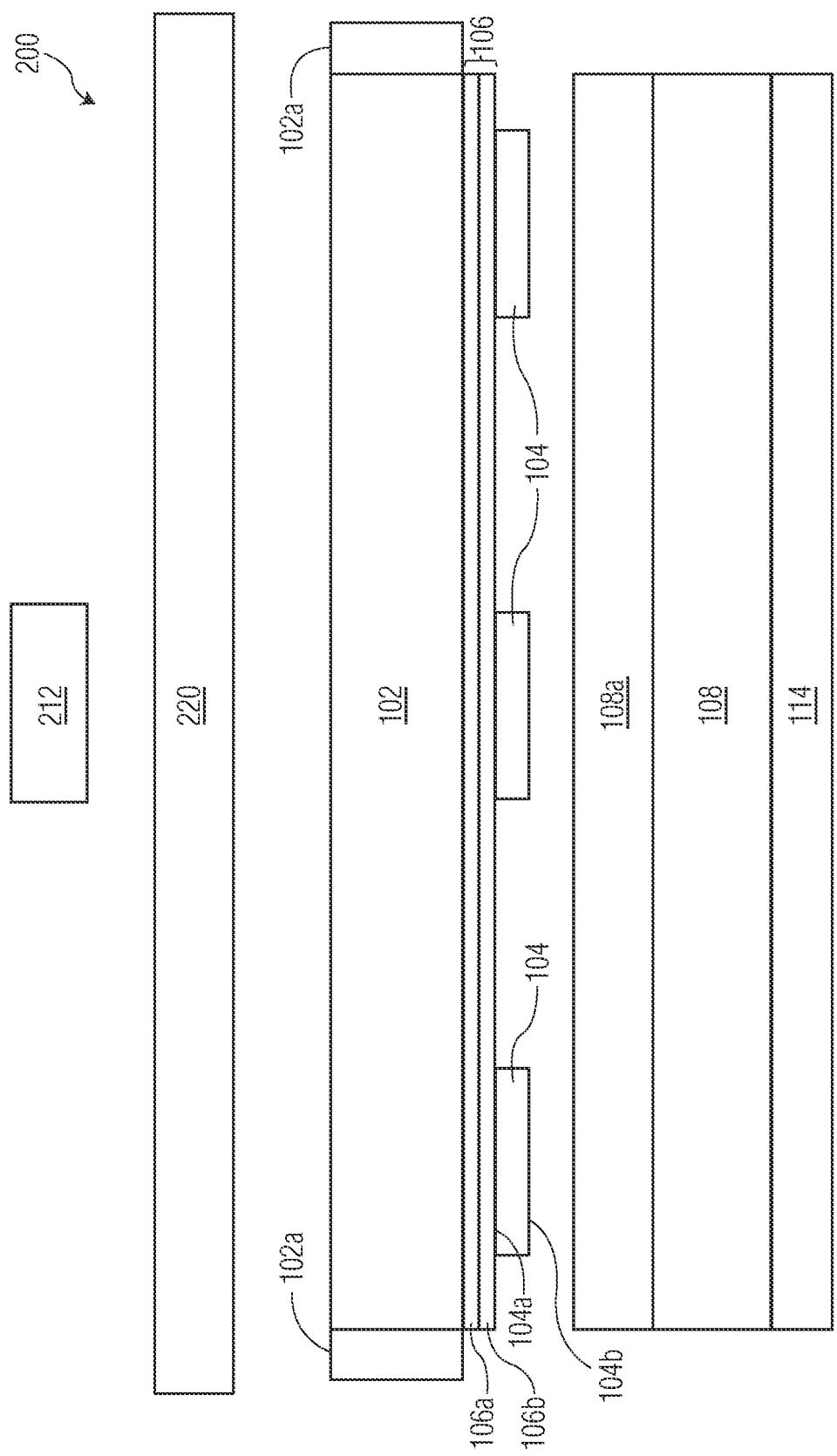

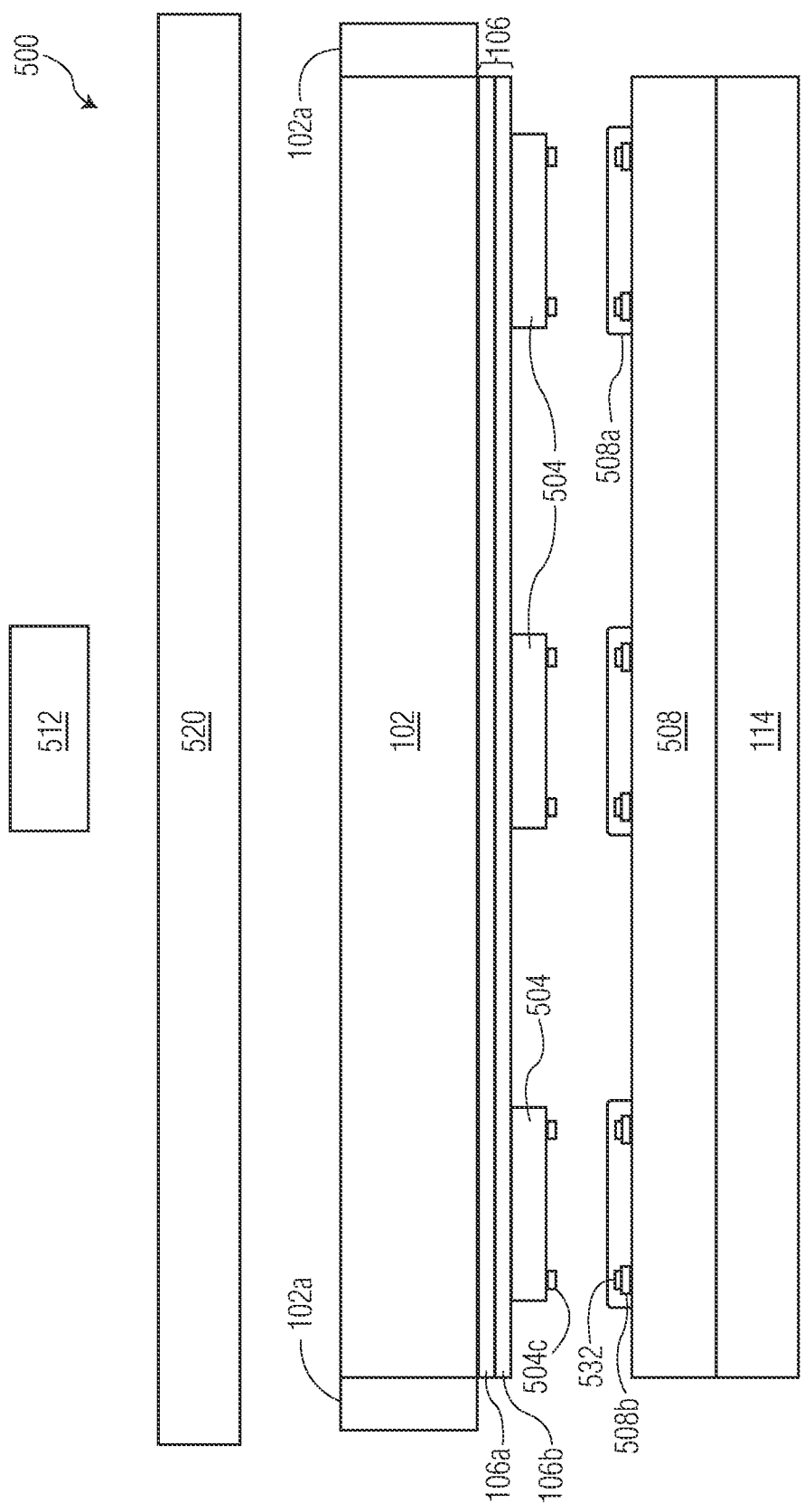

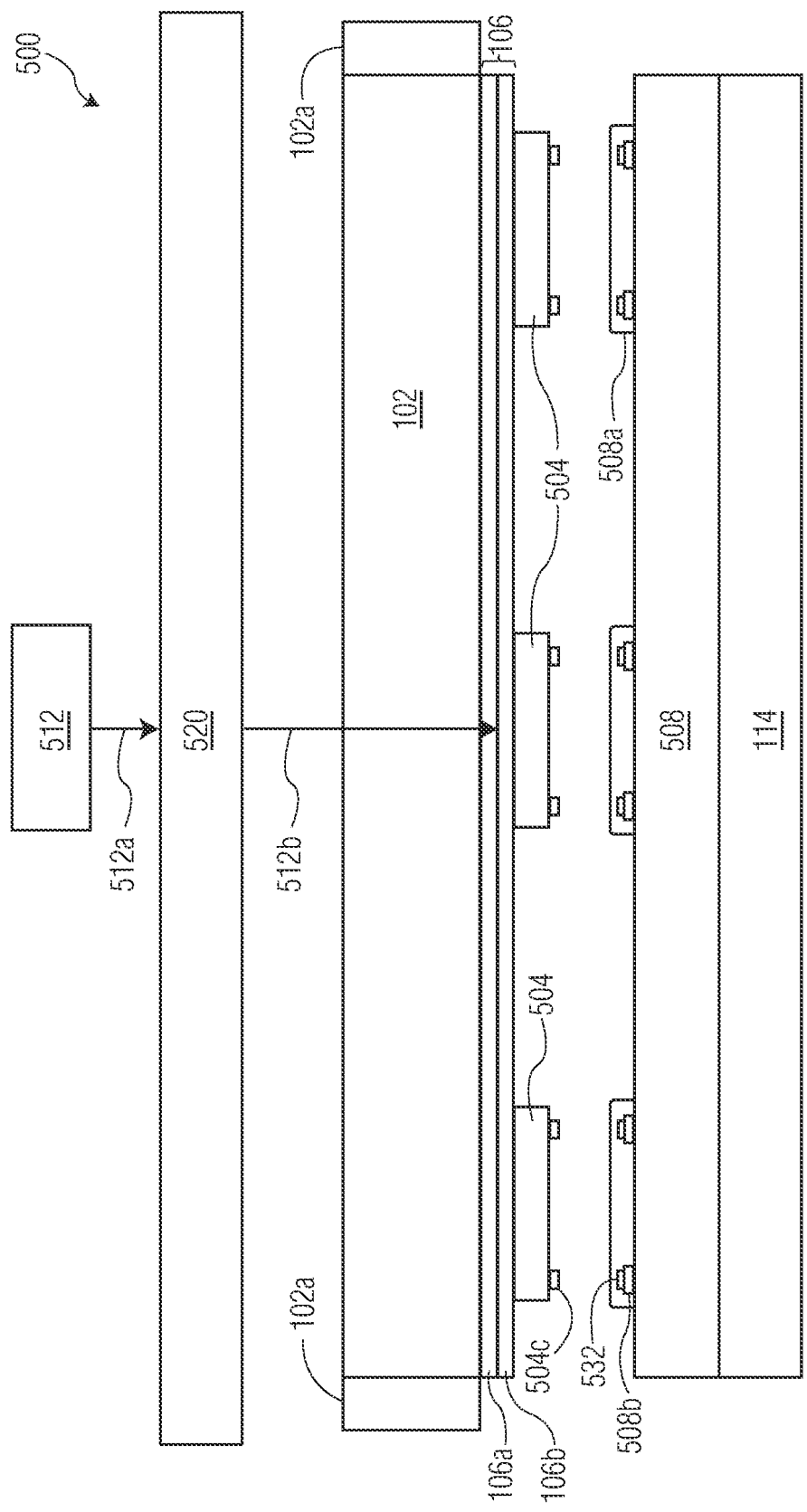

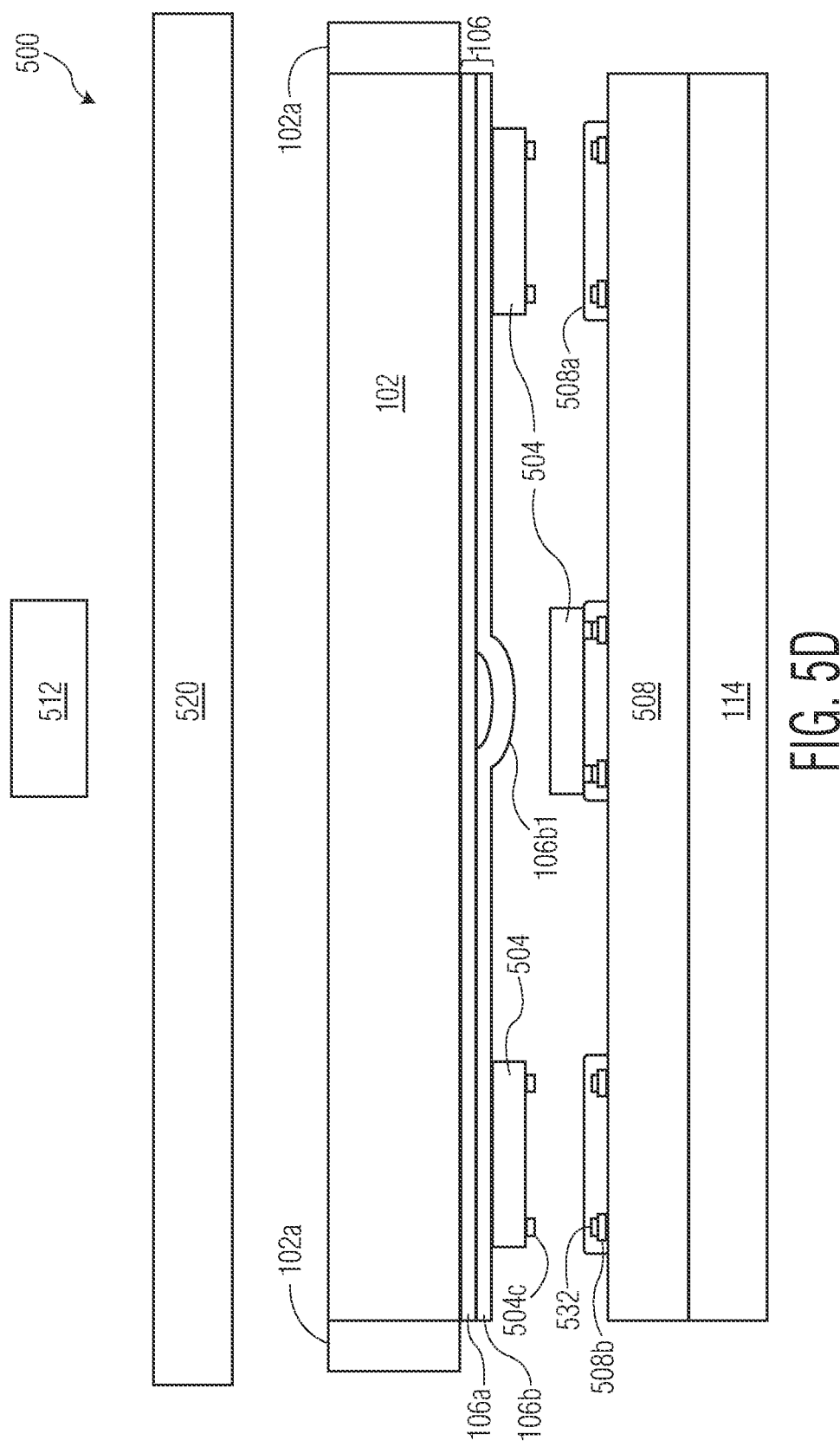

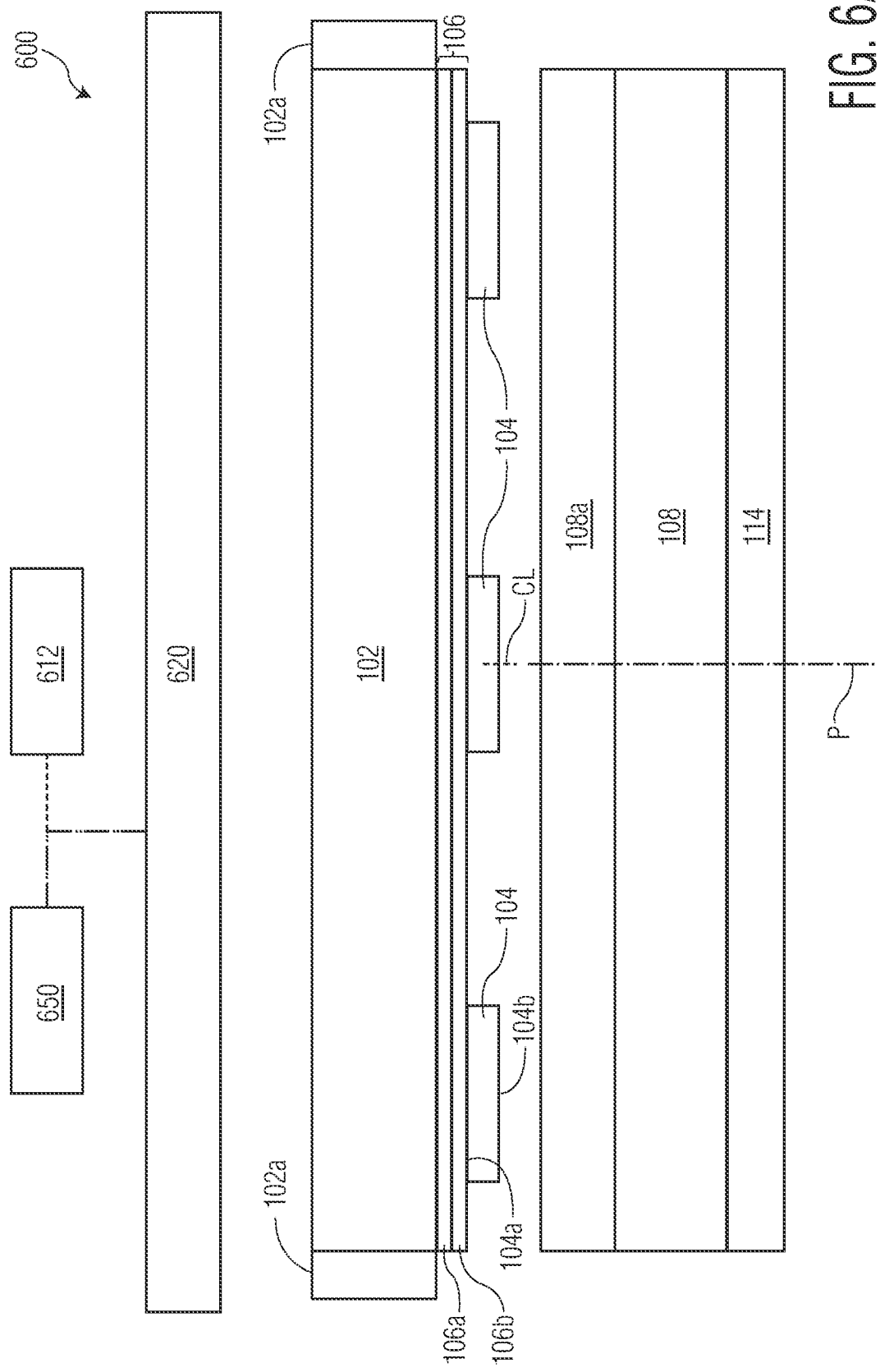

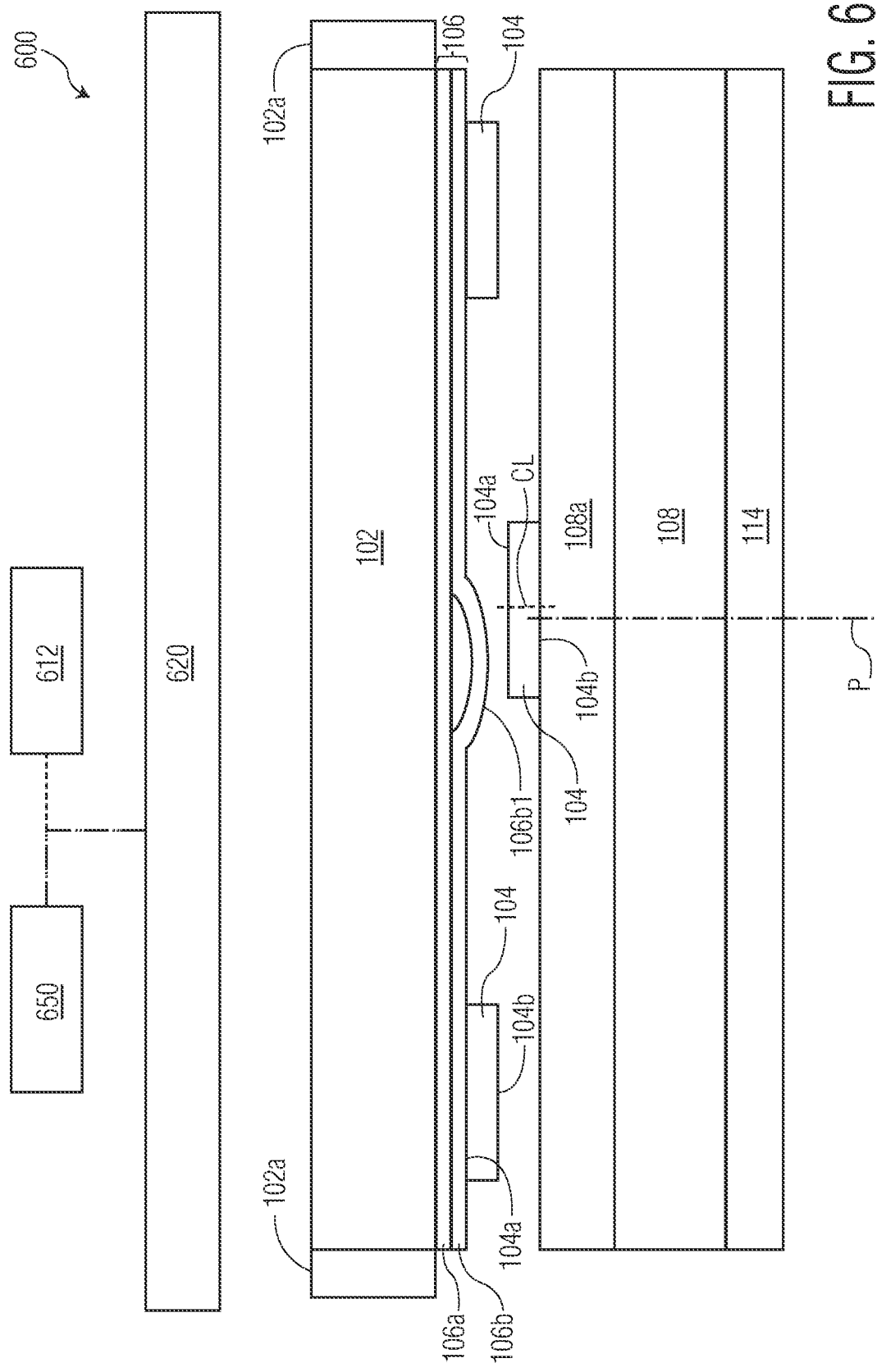

METHODS OF TRANSFERRING A DIE FROM A CARRIER TO A RECEIVE SUBSTRATE, AND RELATED SYSTEMS AND MATERIALS

CROSS-REFERENCE TO RELATED APPLICATION

This application claims the benefit of U.S. Provisional Application No. 63/251,437, filed on Oct. 1, 2021, the content of which is incorporated herein by reference.

FIELD

The invention relates to systems, materials, and methods for transfer of a die from a carrier to a receive substrate and, in particular, to improved systems and methods for transferring the die using a transfer material.

BACKGROUND

In the semiconductor assembly and manufacturing industry, die placement and transfer utilizes a number of different technologies. One example type of die are LED (e.g., light emitting diode) die. Such LED die may be used in connection with the assembly and manufacture of various types of displays.

Exemplary technologies related to die transfer (including LED die transfer, and/or laser based transfer) are disclosed in the following patent documents, each of which is incorporated by reference herein: U.S. Pat. No. 9,862,141 (entitled "SELECTIVE LASER-ASSISTED TRANSFER OF DISCRETE COMPONENTS"); U.S. Pat. No. 10,748,802 (entitled "PLACING ULTRA-SMALL OR ULTRA-THIN DISCRETE COMPONENTS"); U.S. Pat. No. 11,201,077 (entitled "PARALLEL ASSEMBLY OF DISCRETE COMPONENTS ONTO A SUBSTRATE"); U.S. Patent Application Publication No. 2022/0238366 (entitled "MATERIAL FOR POSITIONAL ERROR COMPENSATION IN ASSEMBLY OF DISCRETE COMPONENTS"); U.S. Patent Application Publication No. 2022/0236557 (entitled "POSITIONAL ERROR COMPENSATION IN ASSEMBLY OF DISCRETE COMPONENTS BY ADJUSTMENT OF OPTICAL SYSTEM CHARACTERISTICS"); U.S. Patent Application Publication No. 2022/0130694 (entitled "DYNAMIC RELEASE TAPES FOR ASSEMBLY OF DISCRETE COMPONENTS"); and International Publication No. WO 2021/126580 (entitled "ADHESIVE TAPES FOR RECEIVING DISCRETE COMPONENTS").

Unfortunately, the transfer and/or placement of certain die (e.g., LED die, mini LED die, micro LED die, etc.), in particular in laser assisted transfer applications, involves a number of complexities (e.g., the accurate placement of the die as it transfers in the air from a carrier to a receive substrate).

Thus, it would be desirable to provide improved systems and methods for transferring die from a carrier to a receive substrate, and improved materials used in connection with the same.

SUMMARY

According to an exemplary embodiment of the invention, a method of transferring a die from a carrier to a receive substrate is provided. The method includes the steps of: (a) supporting a die on a carrier, a transfer material being provided between the die and the carrier; (b) exposing the transfer material to light energy to form a bubble in the transfer material; and (c) transferring the die from the carrier to a receive substrate using the bubble, the die being in contact with the bubble when the die contacts the receive substrate.

According to another exemplary embodiment of the invention, a system for transferring a die from a carrier to a receive substrate is provided. The system includes a carrier for supporting a die. The system also includes a transfer material being disposed between the die and the carrier while the die is being supported by the carrier. The system also includes a receive substrate configured to receive the die from the carrier. The system also includes a light source for providing light energy to the transfer material to cause a bubble to form in the transfer material. The die is transferred from the carrier to the receive substrate using the bubble. The die is in contact with the bubble when the die contacts the receive substrate.

According to yet another exemplary embodiment of the invention, a transfer material for use in transferring a die from a carrier to a receive substrate is provided. The transfer material includes a reactive portion for receiving light energy from a light source. The transfer material also includes a die contact portion including a first side and a second side. The die contact portion is coupled to the reactive portion on the first side. The die contact portion is configured to support a die on the second side. The die contact portion is configured to form a bubble after receiving light energy to transfer the die from a carrier to a receive substrate. The die is in contact with the bubble when the die contacts the receive substrate.

BRIEF DESCRIPTION

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawings are the following figures:

FIGS. 1A-1D are a series of block diagram side views of a transfer system illustrating a method of transferring of a die from a carrier to a receive substrate in accordance with an exemplary embodiment of the invention;

FIGS. 2A-2D are a series of block diagram side views of another transfer system illustrating another method of transferring of a plurality of die from a carrier to a receive substrate in accordance with an exemplary embodiment of the invention;

FIGS. 5A-5D are a series of block diagram side views of yet another transfer system illustrating yet another method of transferring a die from a carrier to a receive substrate in accordance with an exemplary embodiment of the invention;

Figure 6B:
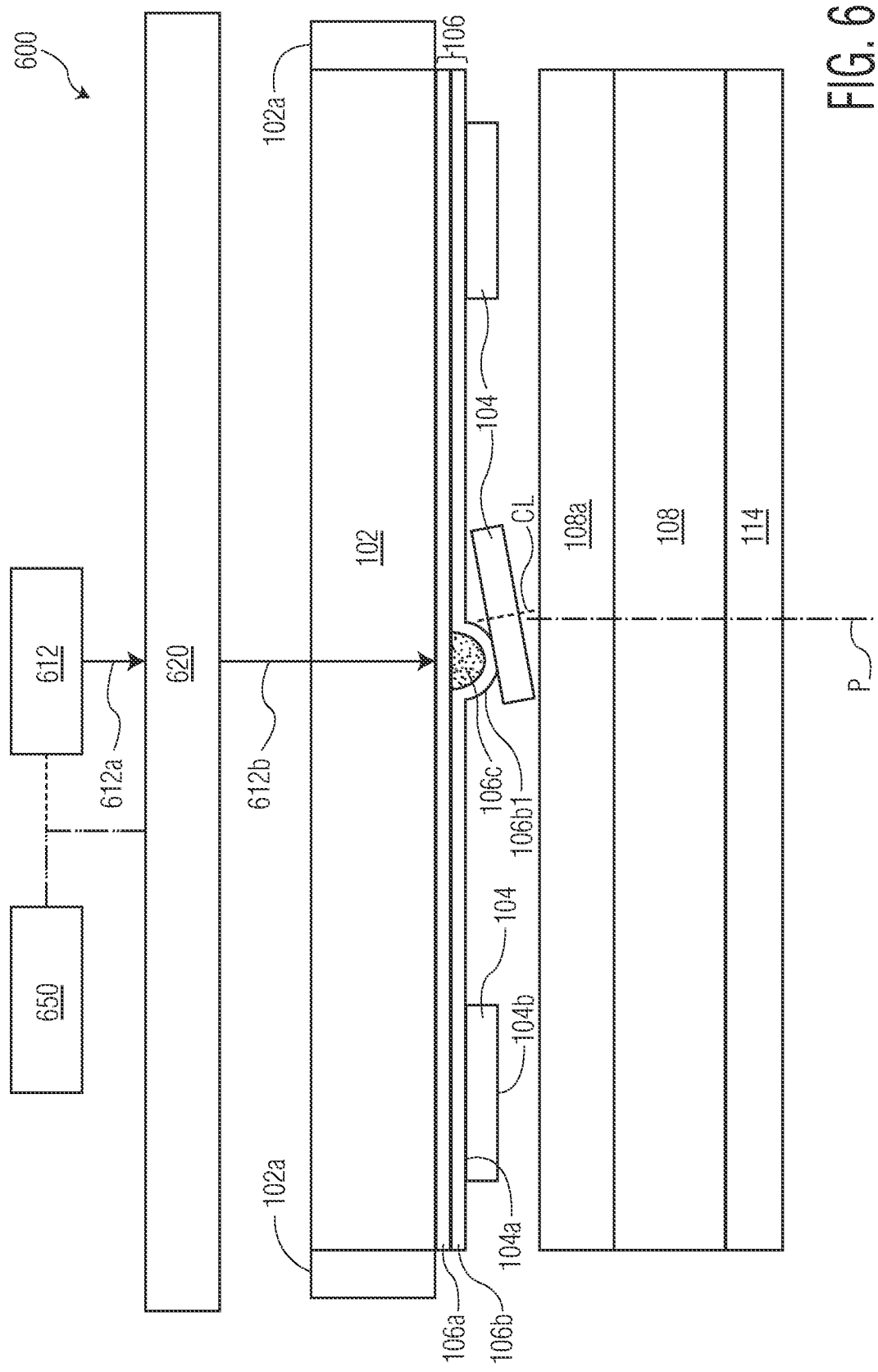
Figure 6C:
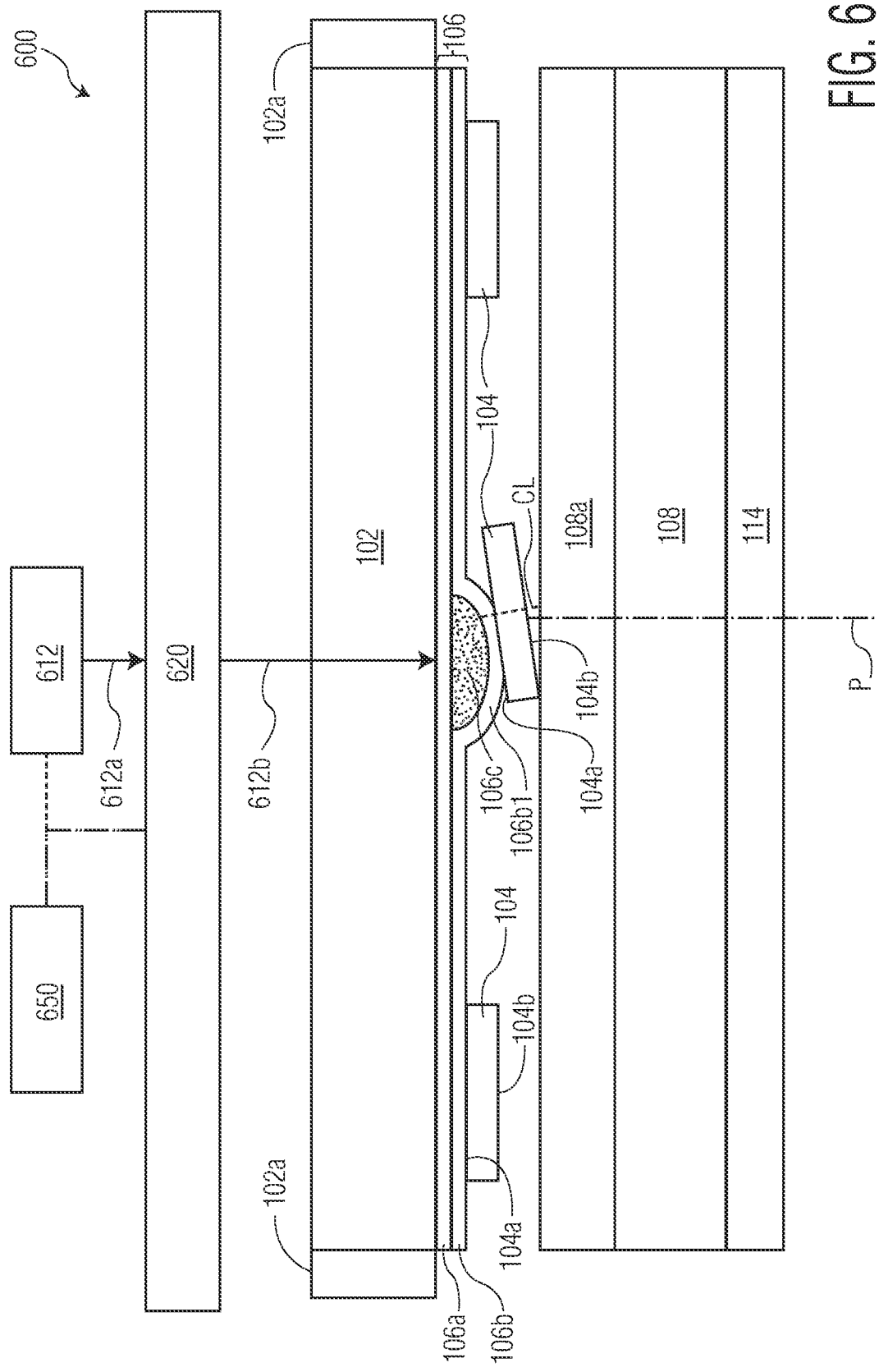
Figure 6D:
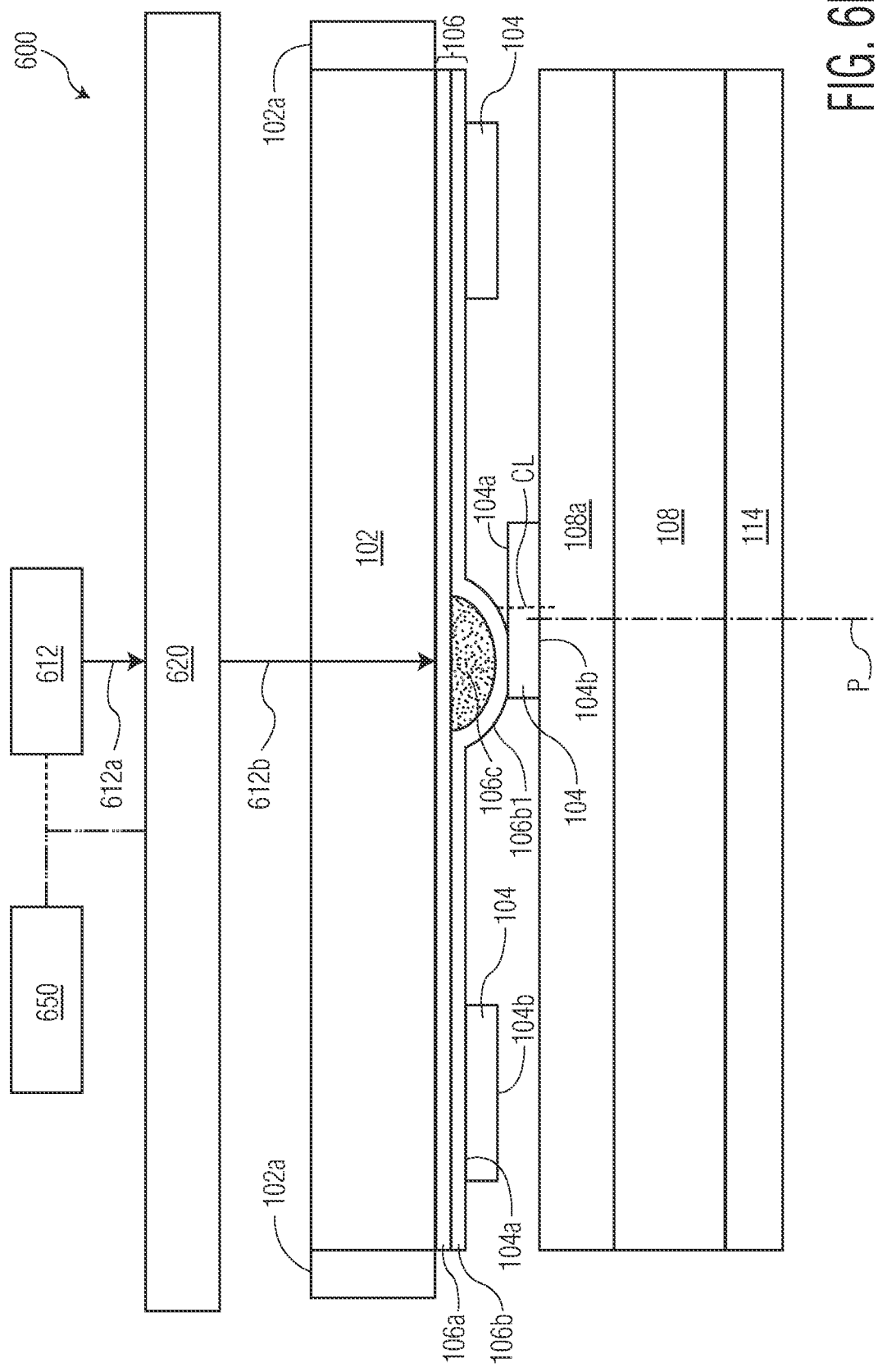
Figure 7:
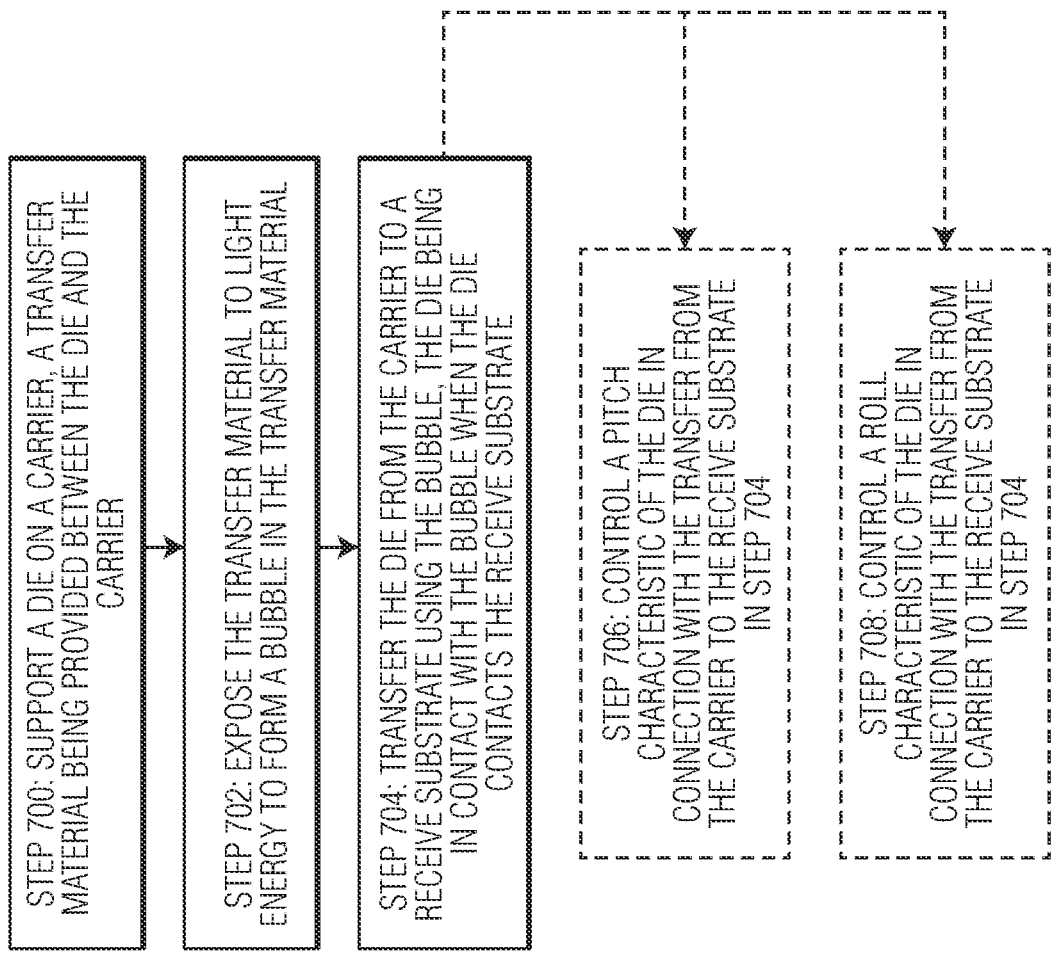

FIGS. 6A-6E are a series of block diagram side views of yet another transfer system illustrating yet another method of transferring a die from a carrier to a receive substrate in accordance with an exemplary embodiment of the invention; and FIG. 7 is a flow diagram illustrating a method of transferring a die from a carrier to a receive substrate in accordance with an exemplary embodiment of the invention.

DETAILED DESCRIPTION

According to certain exemplary embodiments of the invention, in a die transfer process, die are transferred from a carrier (e.g., a die source) to a receive substrate (e.g., a target substrate). As used herein, the term "die" shall be broadly defined to include any type of semiconductor element, or any component including such a semiconductor element, or any other electronic component. Exemplary die include light emitting diodes (i.e., LEDs), mini LEDS, micro LEDs, etc.

In certain example applications, a plurality of die are mounted on a carrier using a die transfer material. The die transfer material is activated by energy (e.g., light energy, a pulse, a laser beam, etc.) from an energy source (e.g., a light source such as a laser light source). The die is transferred from die transfer material to a die catch material mounted on a receive substrate. The die catch material serves to hold the die in a received position. As used herein, a "transfer process" (sometimes referred to as a die transfer process or transfer mechanism) means a process which moves a die from one element to another (e.g., from a carrier to a receive substrate). A laser based transfer process (e.g., which may also be referred to as a laser assisted transfer process) may include a number of processes, including a bubble forming process whereby a bubble (or a plurality of bubbles) is formed in a die transfer material. The bubble is used to transfer (e.g., carry, actuate, etc.) the die to the receive substrate.

As used herein, the term "carrier" is intended to refer to any structure which carries a plurality of die (directly or indirectly) (or even a single die) in connection with a die transfer process. Exemplary carriers include: a rigid substrate; a glass substrate; a laser transparent substrate; a flexible freestanding carrier; and/or other freestanding structures used to transport substrates and/or die. Freestanding structures (such as carriers and/or freestanding dynamic release tapes) are described in U.S. Patent Application Publication No. 2022/0130694 (entitled "DYNAMIC RELEASE TAPES FOR ASSEMBLY OF DISCRETE COMPONENTS"), the content of which is incorporated herein by reference. As used herein, the term "die catch material" is intended to refer to a material which is used to receive a die during a transfer process. A die catch material may include at least one of: a homogenous material; a heterogenous material; a multi-layered material; an adhesive material; an energy absorbing material; and/or a kinetic energy absorbing material.

Throughout the present application die catch materials and die transfer materials are described. An example structure of a die catch material includes: a base layer (e.g., a PET material); an energy absorbing layer (e.g. a Bingham plastic); and/or an adhesive layer. An example structure of a die transfer material includes: a base layer (e.g., a PET material); a laser absorption layer (e.g., a polyimide material); a bubble layer; and/or an adhesive layer (where any combination of the laser absorption layer, bubble layer, and the adhesive layer could be distinct layers, multiple layers, or could be a single layer of material that serves multiple functions).

In some examples described herein, systems and methods of transfer utilize a "bubble" to transfer at least one die from a carrier to a receive substrate. As used herein, a "bubble" refers to a protruding feature formed as part of a transfer material (where the transfer material is used to transfer the die from a carrier to a receive substrate), where the bubble results from exposing the transfer material to a stimulus. For example, a portion of a transfer material is exposed to light energy (i.e., a stimulus), causing the portion of the transfer material to generate a gas (e.g., through vaporization, sublimation, etc.), thereby creating a bubble. Transferring a die via a bubble tends to have distinct advantages over other transfer methods, including better control over the die as well as providing the ability to apply pressure to the die on the receive substrate. Transferring a die via a bubble is similar in some ways to a mechanical transfer method, which is advantageous in some processes. By pushing (in other words "actuating") the die with the bubble, bubble transfer processes avoid issues associated with releasing a die (i.e., processes where, at some point, the die is not contacting anything other than air), such as misalignment, poor adhesion, poor positioning, uncontrolled pitch, uncontrolled roll, uncontrolled yaw, uncontrolled spacing between die, uncontrolled velocity, uncontrolled impact force, uncontrolled placement force, and other problems associated with indirect transfer processes.

Figure 1A:
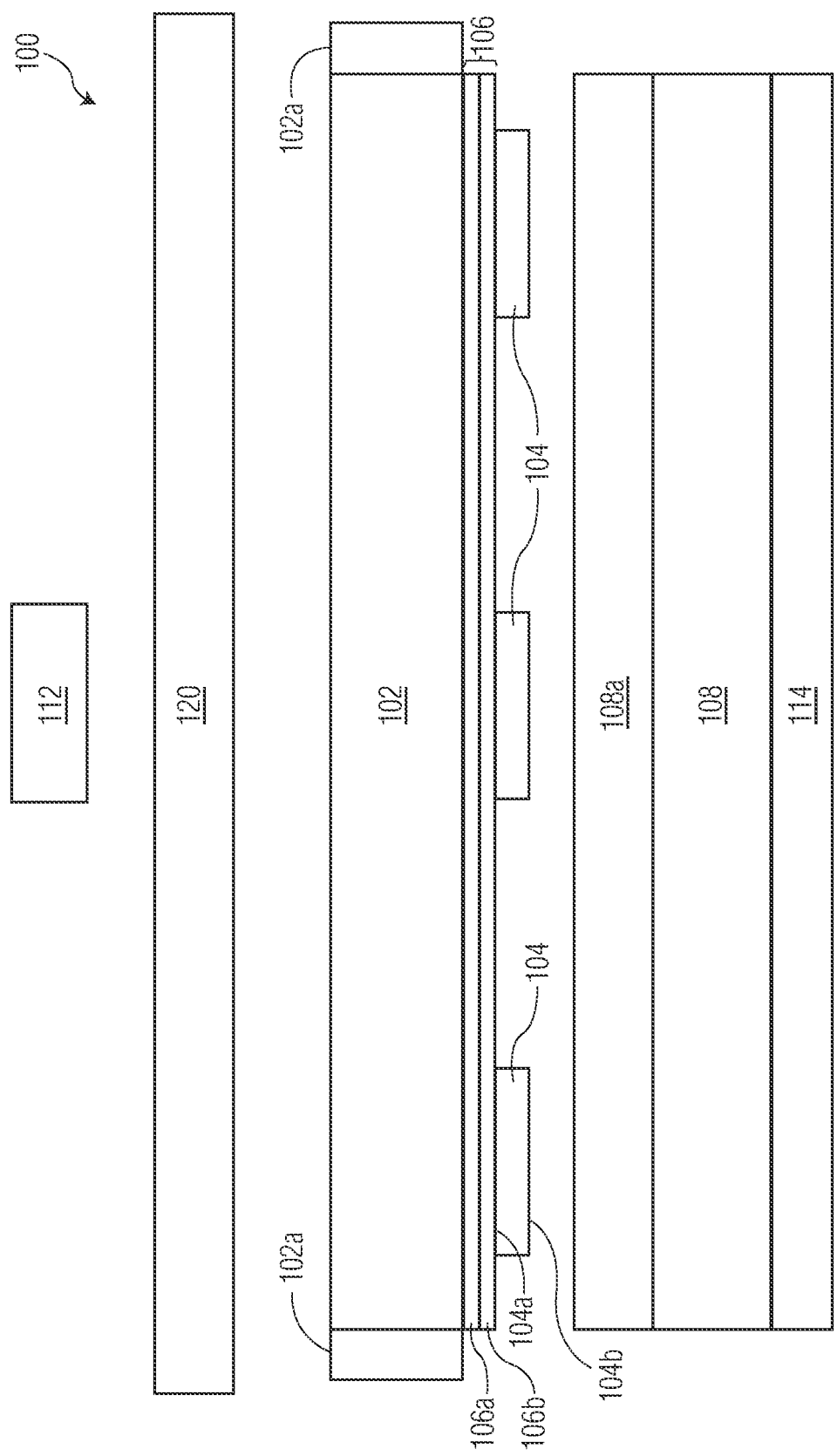

FIGS. 1A-1D illustrate the transfer of a die 104 from a carrier 102 to a receive substrate 108. Referring specifically to FIG. 1A, a transfer system 100 is illustrated and includes: carrier 102 supported by a carrier support 102a (e.g., a wafer ring or other type of carrier support); receive substrate 108 supported by a support structure 114; a light source 112; and an optical assembly 120. Carrier 102 (e.g., a laser transmissive carrier, a flexible freestanding carrier, etc.) supports a plurality of die 104 via a transfer material 106. Transfer material 106 is disposed between the plurality of die 104 and carrier 102. In the illustrated example, transfer material 106 includes a reactive portion 106a and a die contact portion 106b (e.g., wafer tape). A first side 104a of each of the plurality of die 104 is in contact with die contact portion 106b. A second side 104b of each of the plurality of die 104 faces receive substrate 108. Receive substrate 108 (which includes a die catch material 108a) is configured to receive the plurality of die 104 from carrier 102. Die catch material 108a has an adhesive characteristic for holding the plurality of die during (and/or after) transfer from carrier 102. In the non-limiting example shown in FIG. 1A, light source 112 and optical assembly 120 are illustrated directly above carrier 102.

Figure 1B:
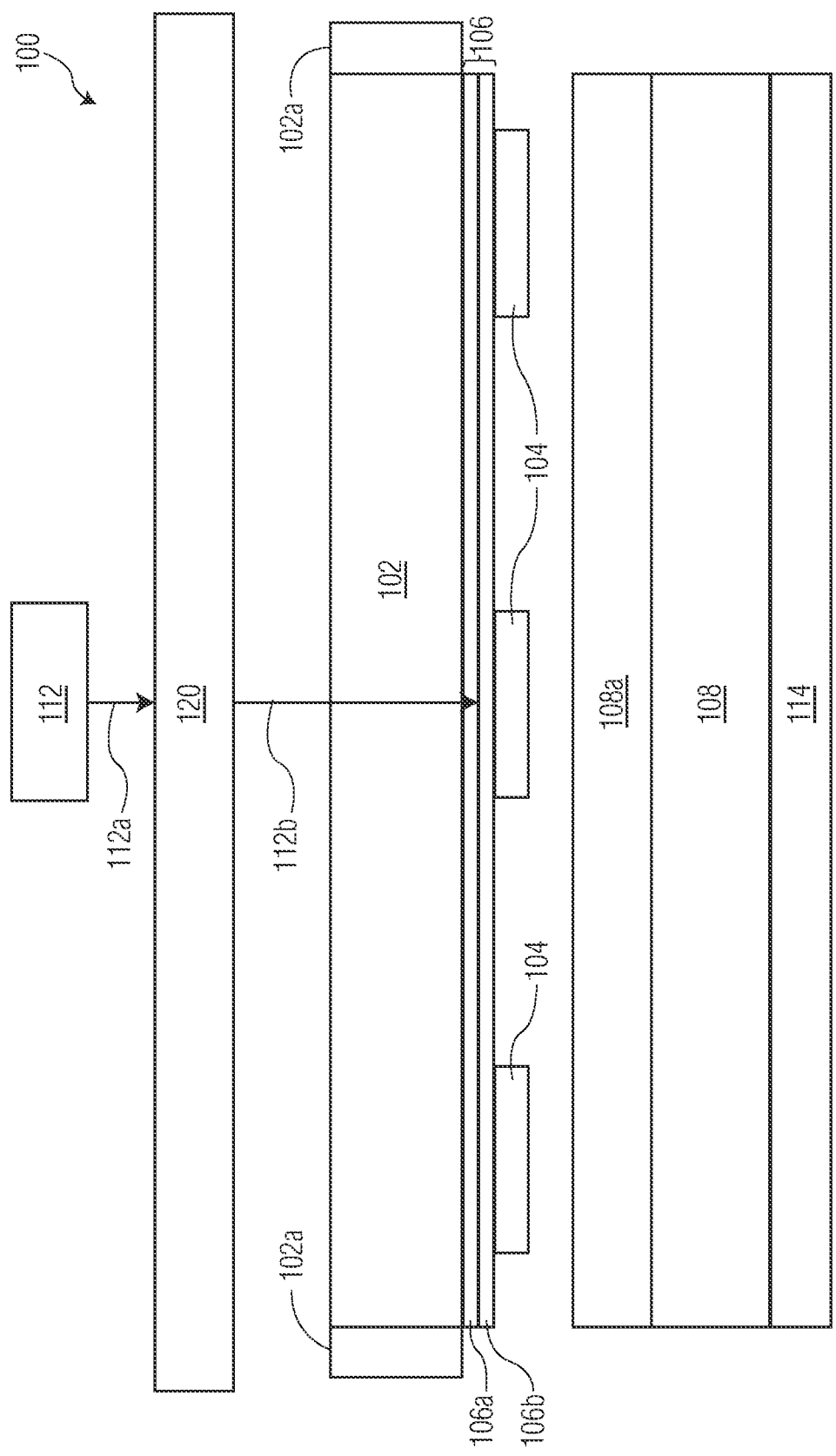
Figure 1D:
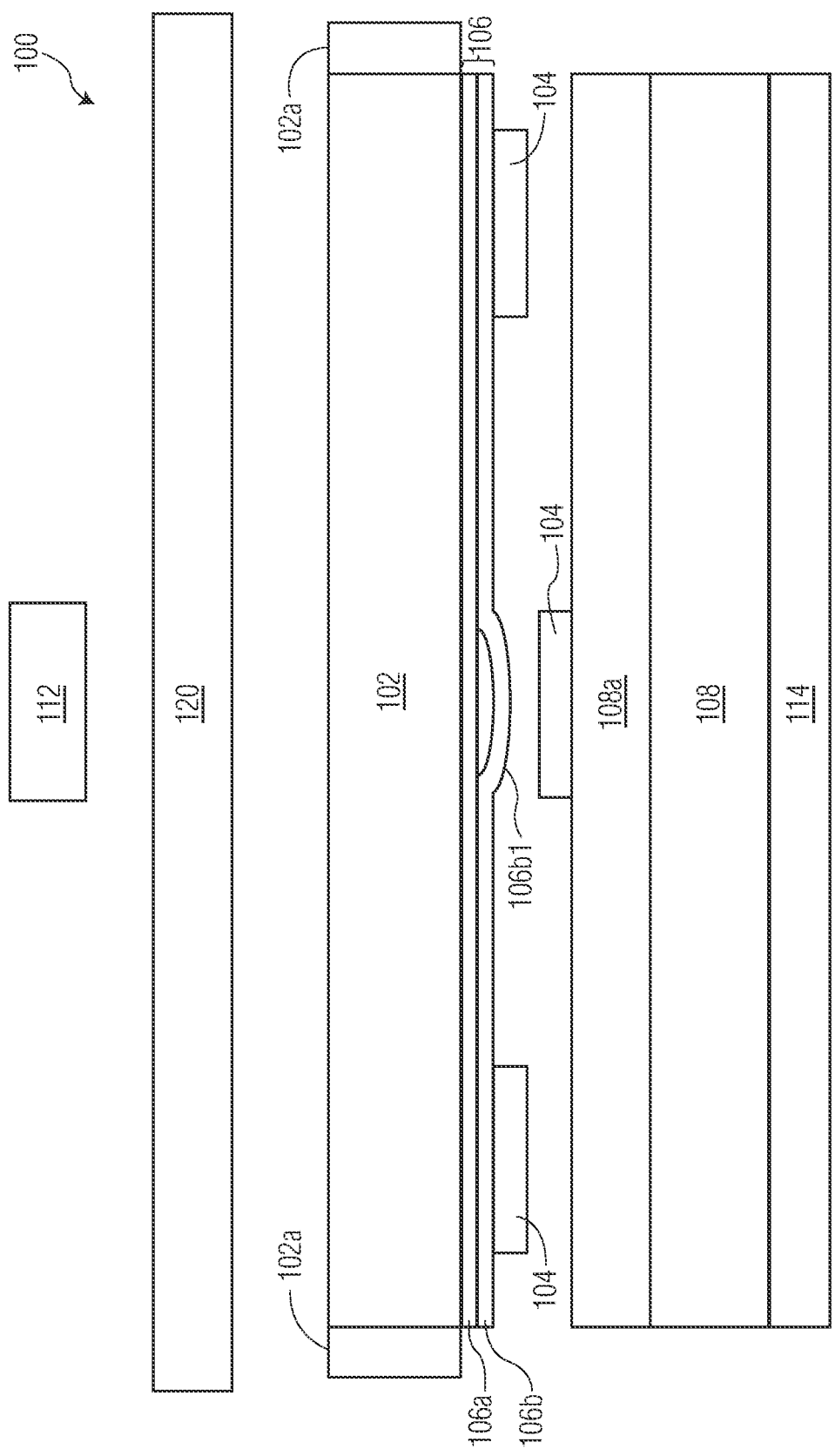

Thus, FIG. 1A illustrates carrier 102 (supporting a plurality of die 104) in a position spaced from receive substrate 108 prior to any transfer process (e.g., a bubble transfer). From this position, die 104 will be transferred from carrier 102 to receive substrate 108 as detailed in FIGS. 1B-1D. Referring specifically to FIG. 1B, light source 112 provides light energy 112a to optical assembly 120. Light energy 112a is modified by optical assembly 120 (e.g., separating a beamlet of light to multiple beamlets, refracting/reflecting light beamlets, increasing/decreasing energy, etc.) and exits optical assembly 120 as light energy 112b. Light energy 112b is transmitted through carrier 102 (e.g., laser transmissive carrier) to reactive portion 106a of transfer material 106. Referring now to FIG. 1C, gas 106c is generated in transfer material 106 (e.g., through a reaction between light energy 112b and transfer material 106) from light energy 112b. Gas 106c causes a bubble 106b1 to be at least partially defined by die contact portion 106b. As gas 106c is generated and bubble 106$b$1 is formed (and expands), die 104 is transferred from carrier 102 to receive substrate 108. As illustrated in FIG. 1C, first side 104$a$ of die 104 remains in contact with bubble 106$b$1, while second side 104$b$ of die 104 is in contact with die catch material 108$a$ of receive substrate 108 (wherein first side 104$a$ is opposite second side 104$b$). Referring now to FIG. 1D, die 104 is illustrated after a transfer process from carrier 102 to receive substrate 108 has been completed. Since the transfer of die 104 is now complete, light source 112 ceases transmitting light energy 112$a$, resulting in the reduction of the volume and/or size of bubble 106$b$1 shown in FIG. 1D.

FIGS. 1A-1D illustrate a single die 104 being transferred from carrier 102 to receive substrate 108 (where such a transfer process can transfer a plurality of die one at a time). As will be appreciated by those skilled in the art, more than one die 104 may be transferred simultaneously from a carrier to a receive substrate in connection with the invention. FIGS. 2A-2D and FIGS. 4A-4D illustrate such examples.

Figure 2B:
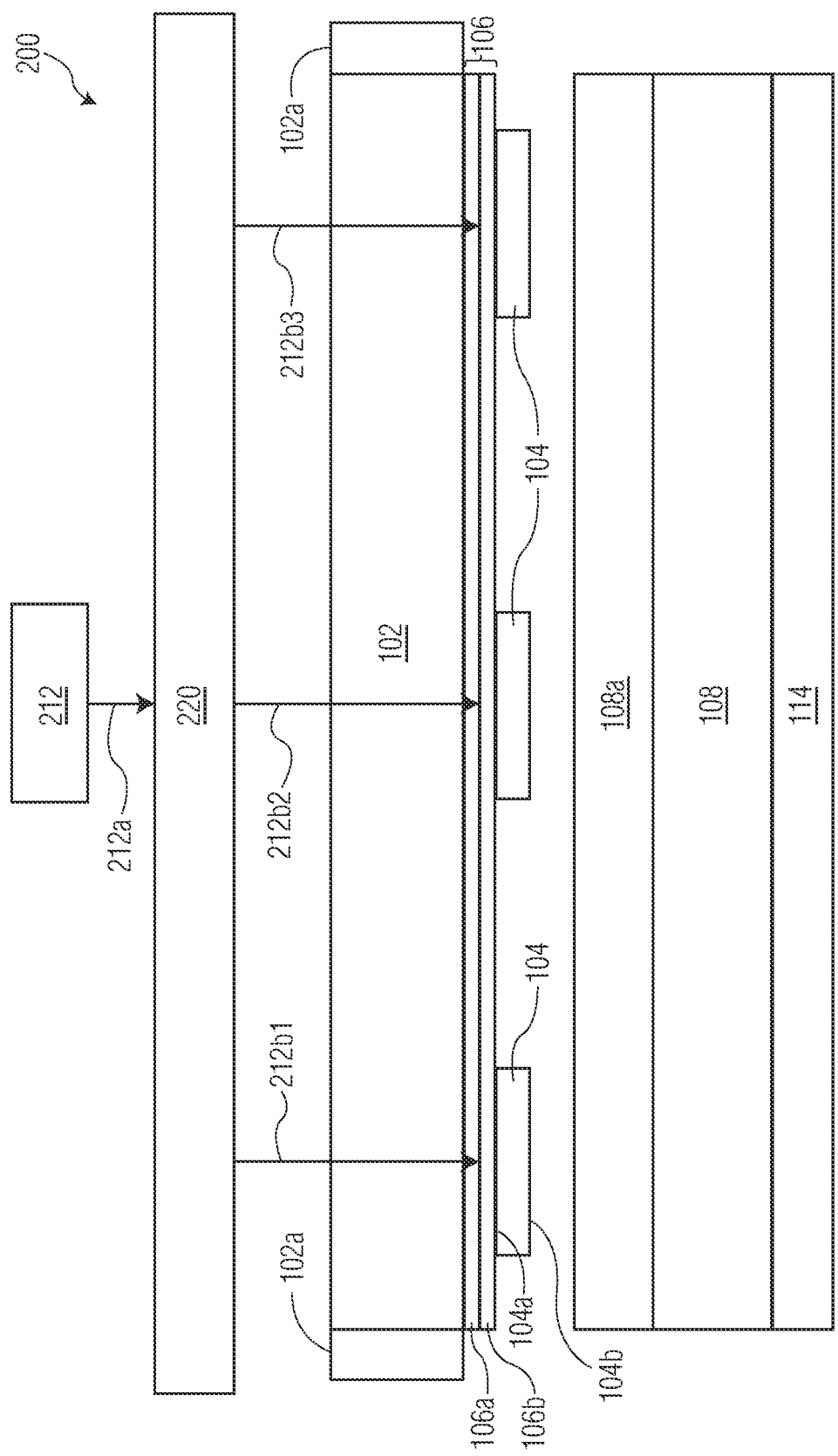

FIGS. 2A-2D illustrate the simultaneous transfer of a plurality of die 104 from carrier 102 to receive substrate 108. Referring specifically to FIG. 2A, a transfer system 200 (similar to transfer system 100 of FIG. 1A, where like elements have the same reference numeral or a numeral beginning with "2" instead of "1") is illustrated. Transfer system 200 includes carrier 102 supported by a carrier support 102$a$ (e.g., a wafer ring or other type of carrier support); receive substrate 108 supported by support structure 114; a light source 212; and an optical assembly 220. The description of FIG. 1A in connection with transfer system 100 is applicable to transfer system 200 except light source 212 and optical assembly 220 are included in lieu of light source 112 and optical assembly 120. In the non-limiting example shown in FIG. 2A, light source 212 and optical assembly 220 are illustrated directly above carrier 102.

Figure 2C:
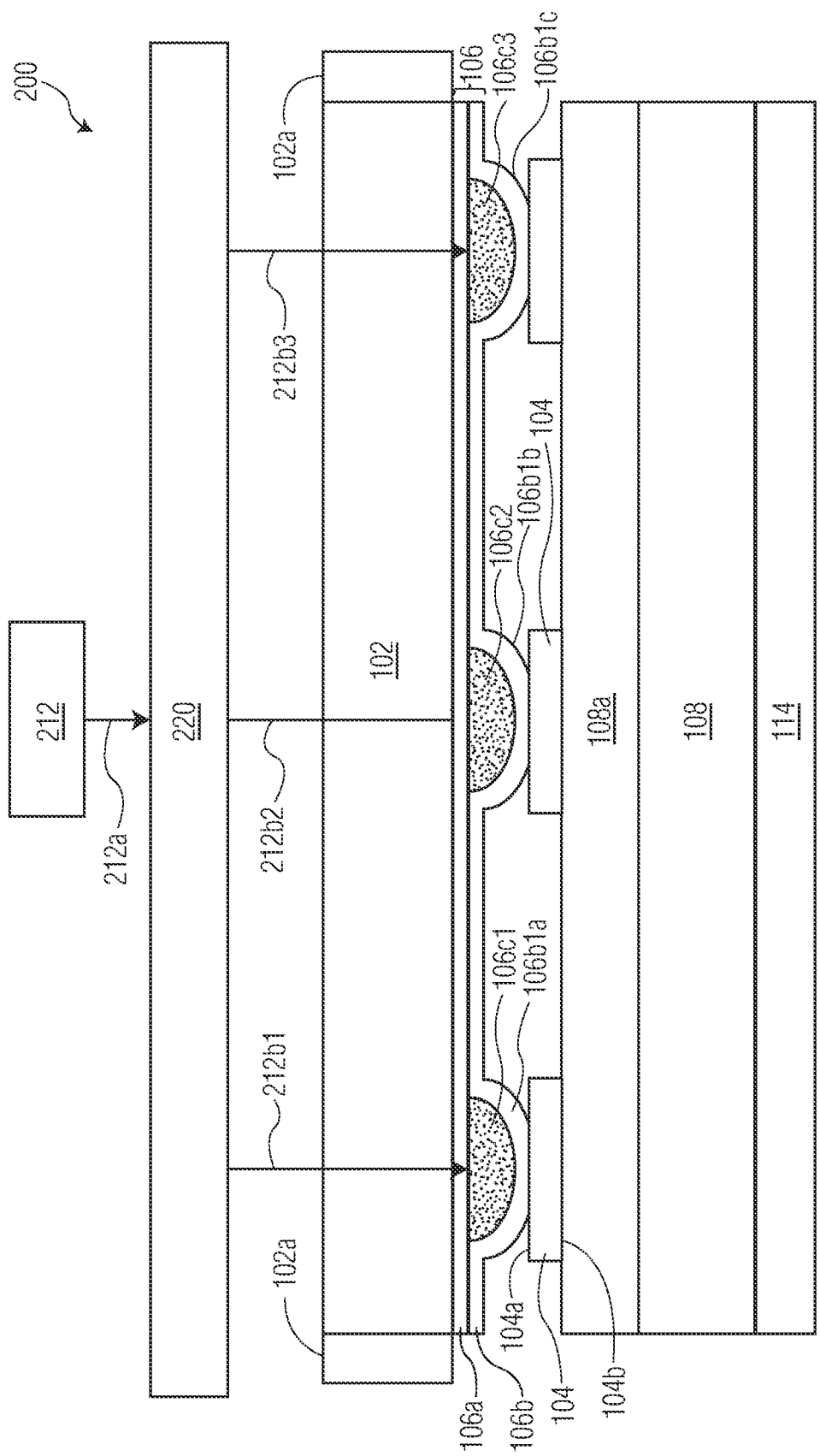
Figure 2D:
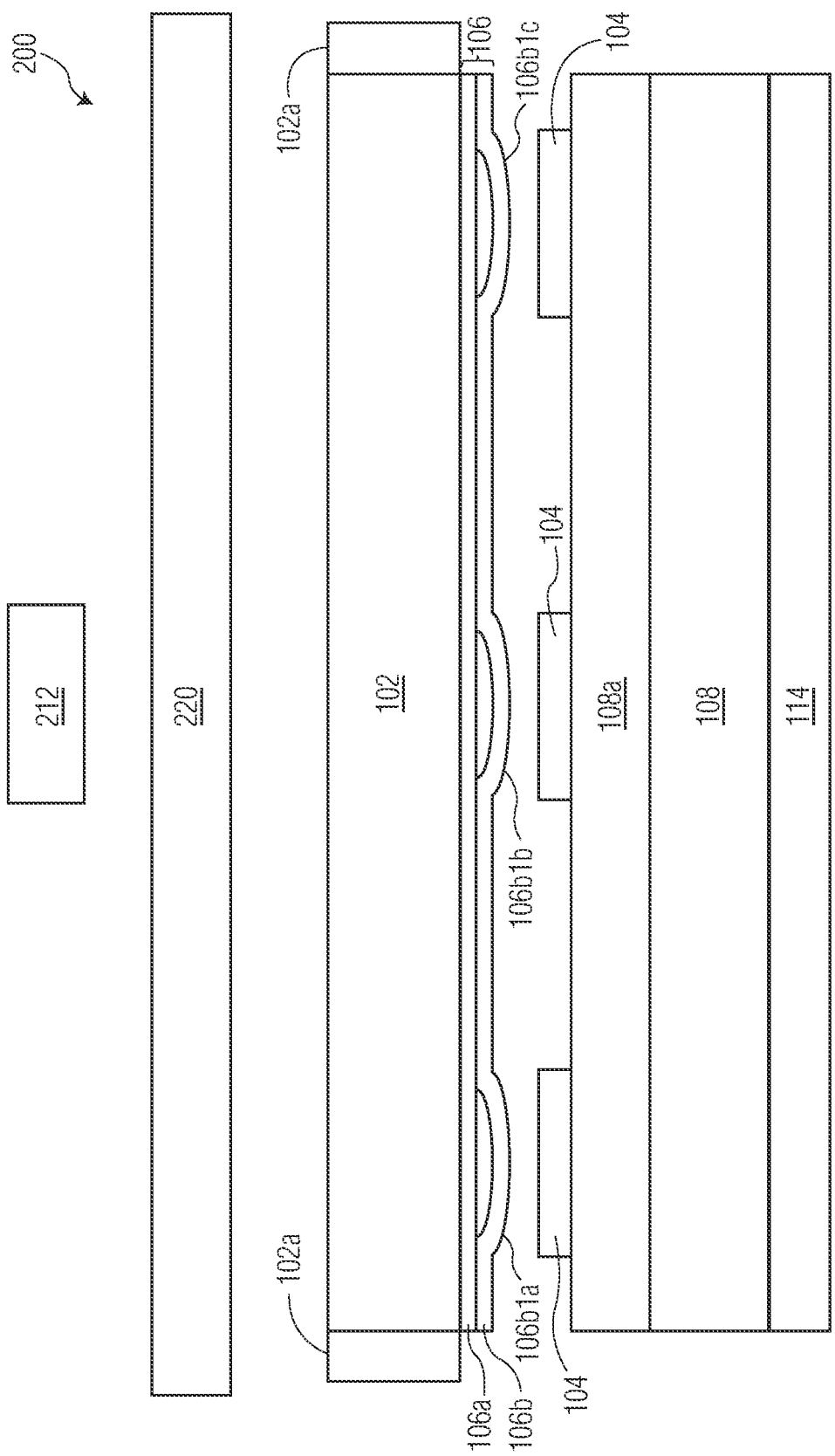

Thus, FIG. 2A illustrates carrier 102 (supporting a plurality of die 104) in a position spaced from receive substrate 108 prior to any transfer process (e.g., bubble transfer). From this position, the plurality of die 104 will be transferred from carrier 102 to receive substrate 108 as detailed in FIGS. 2B-2D. Referring specifically to FIG. 2B, light source 212 provides light energy 212$a$ to optical assembly 220. Light energy 212$a$ is modified by optical assembly 220 (e.g., separating a beamlet of light to multiple beamlets, refracting/reflecting light beamlets, redirecting light energy, increasing/decreasing power, etc.) and exits optical assembly 220 as light energy 212$b$1, 212$b$2, and 212$b$3. Light energy 212$b$1, 212$b$2, and 212$b$3 are transmitted through carrier 102 (e.g., laser transmissive carrier) to reactive portion 106$a$ of transfer material 106. Referring now to FIG. 2C, gas 106$c$1, 106$c$2, and 106$c$3 is generated in transfer material 106 (e.g., in reactive portion 106$a$) from light energy 212$b$1, 212$b$2, and 212$b$3, respectively. Gas 106$c$1, 106$c$2, and 106$c$3 causes bubble 106$b$1$a$, 106$b$1$b$, and 106$b$1$c$ to be at least partially defined by die contact portion 106$b$. As gas 106$c$1, 106$c$2, and 106$c$3 is generated, corresponding bubbles 106$b$1$a$, 106$b$1$b$, and 106$b$1$c$ are formed (and expand) and the plurality of die 104 are transferred from carrier 102 to receive substrate 108. As illustrated in FIG. 2C, first side 104$a$ (of each of the plurality of die 104) remains in contact with bubble 106$b$1$a$, 106$b$1$b$, and 106$b$1$c$ while second side 104$b$ (of each of the plurality of die 104) is in contact with die catch material 108$a$ of receive substrate 108. Referring now to FIG. 2D, the plurality of die 104 are illustrated after a transfer process from carrier 102 to receive substrate 108 has been completed. Since the transfer of the plurality of die 104 is now complete, light source 212 ceases transmitting light energy 212$a$, resulting in the reduction of the volume and/or size of bubble 106$b$1$a$, 106$b$1$b$, and 106$b$1$c$ illustrated in FIG. 2D.

Figure 3A:
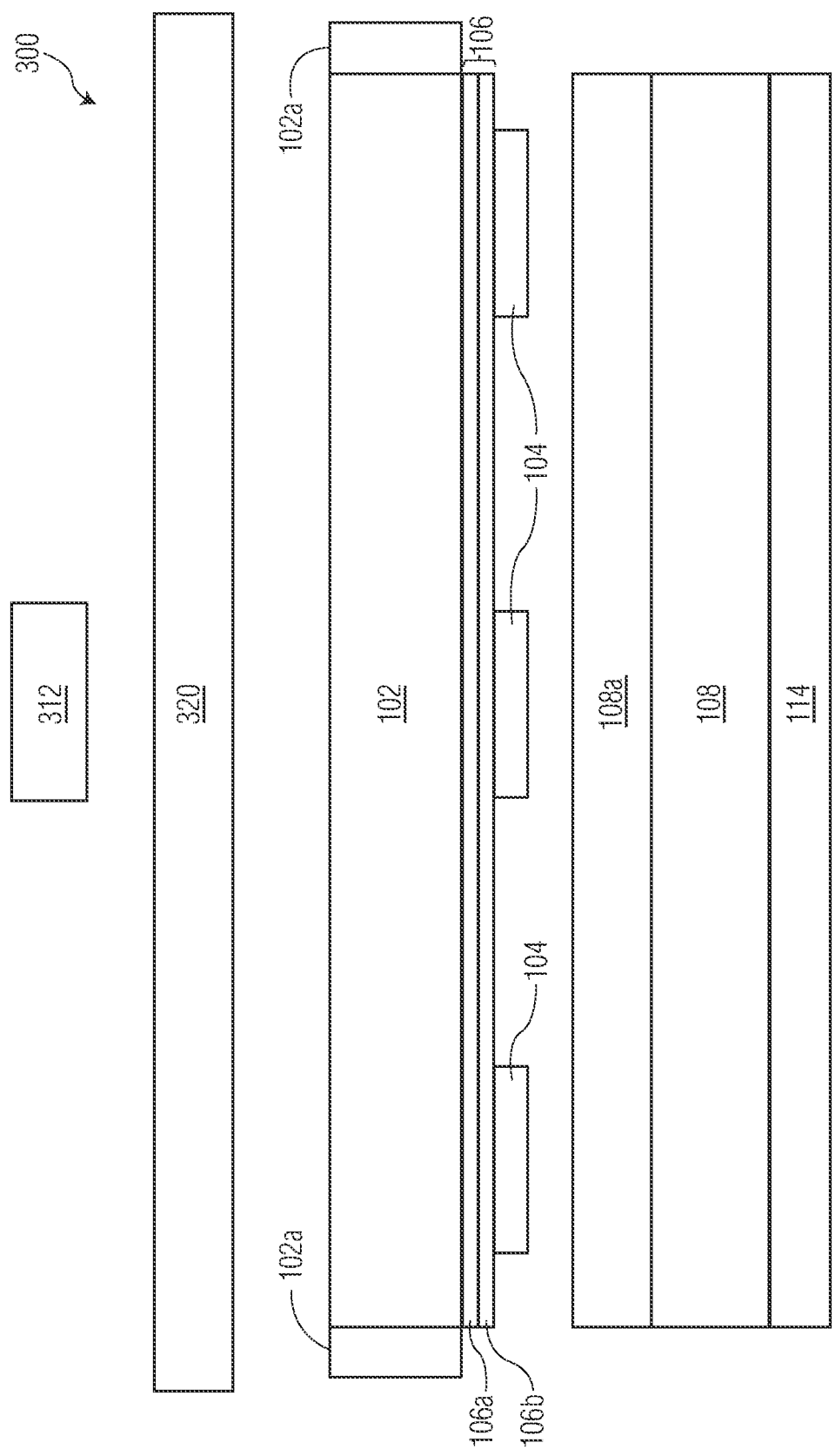
FIGS. 3A-3D are a series of block diagram side views of yet another transfer system illustrating yet another method of transferring a die from a carrier to a receive substrate in accordance with an exemplary embodiment of the invention.

FIGS. 3A-3D illustrate the transfer of a die 104 from a carrier 102 to a receive substrate 108. Referring specifically to FIG. 3A, a transfer system 300 (similar to transfer system 100 of FIG. 1A, where like elements have the same reference numeral or a numeral beginning with "3" instead of "1") is illustrated. Transfer system 300 includes carrier 102 supported by a carrier support 102$a$ (e.g., a wafer ring or other type of carrier support); receive substrate 108 supported by support structure 114; a light source 312; and an optical assembly 320. The description of FIG. 1A in connection with transfer system 100 is applicable to transfer system 300 except light source 312 and optical assembly 320 are included in lieu of light source 112 and optical assembly 120. In the non-limiting example shown in FIG. 3A, light source 312 and optical assembly 320 are illustrated directly above carrier 102.

Figure 3B:
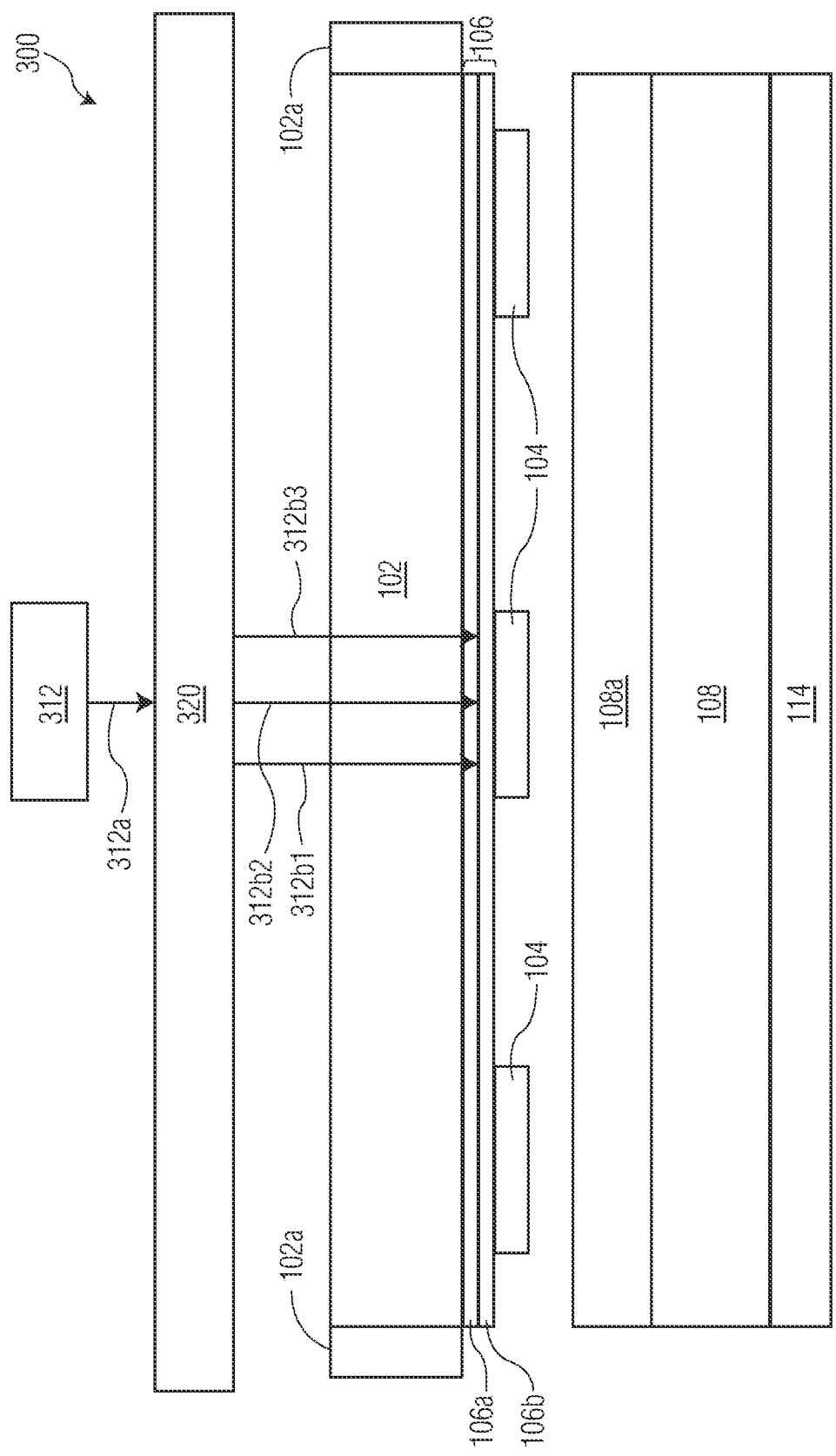
Figure 3C:
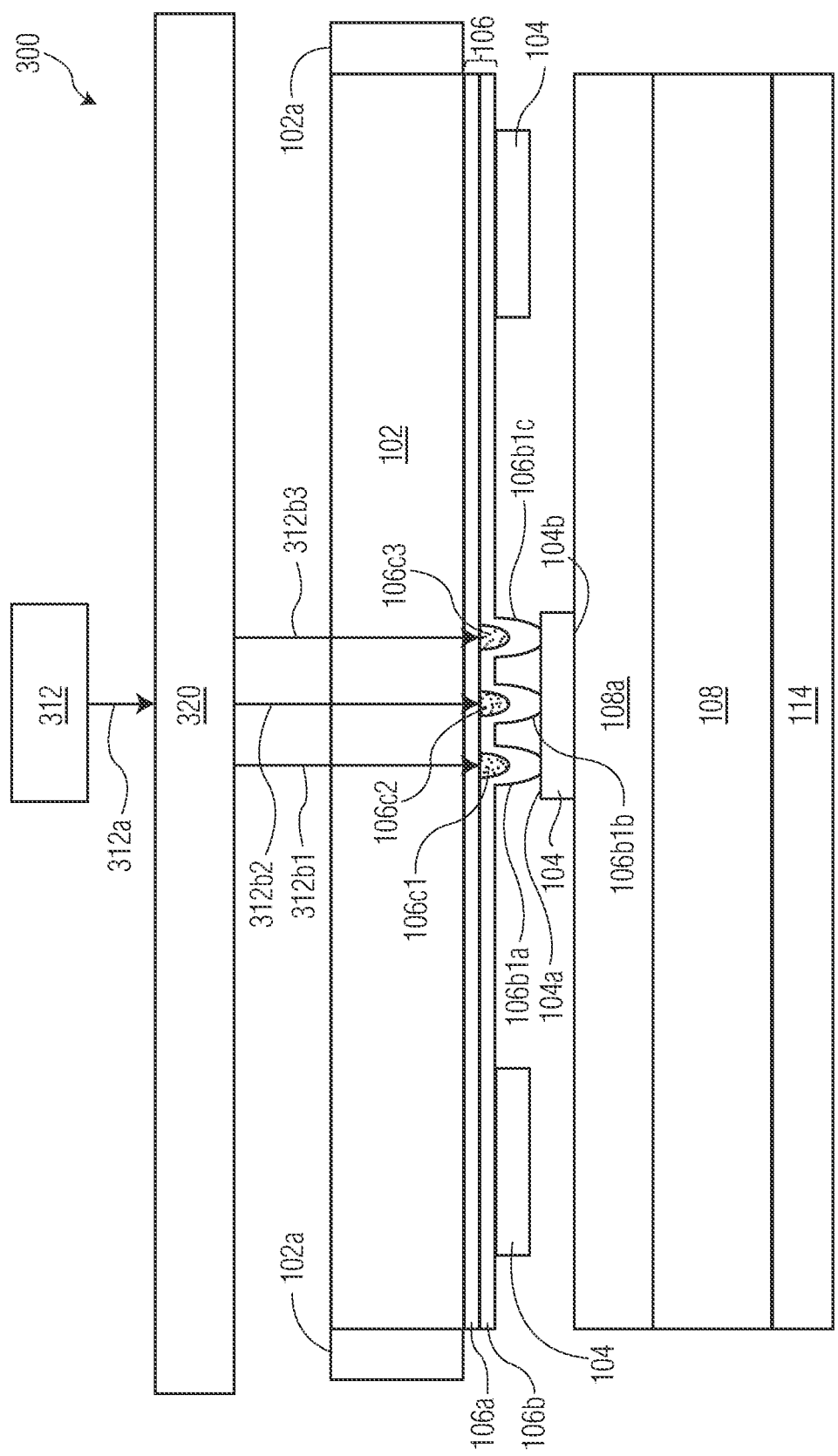
Figure 3D:
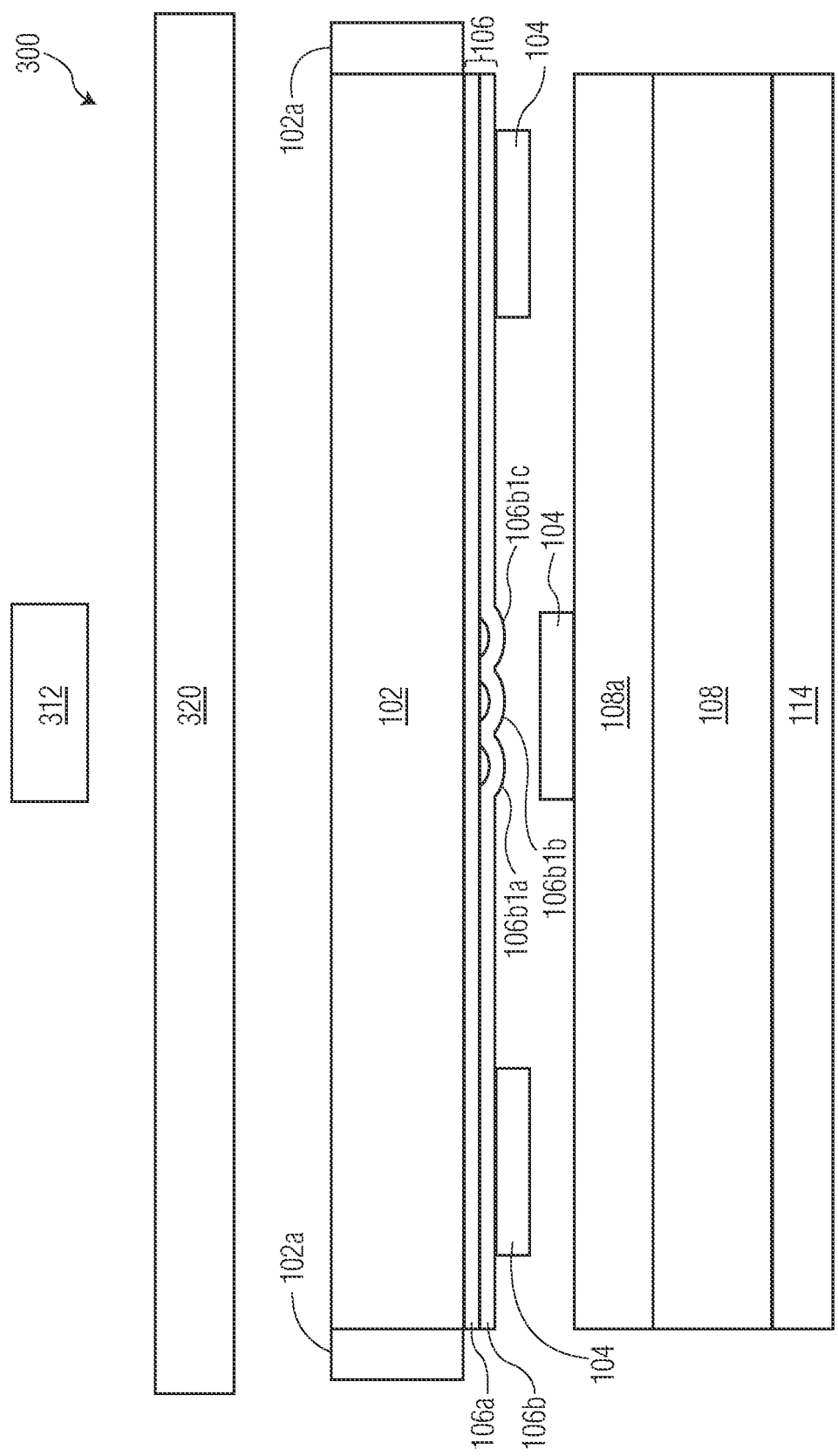

Thus, FIG. 3A illustrates carrier 102 (supporting the plurality of die 104) in a position spaced from receive substrate 108 prior to any transfer process (e.g., bubble transfer). From this position, die 104 will be transferred from carrier 102 to receive substrate 108 as detailed in FIGS. 3B-3D. Referring specifically to FIG. 3B, light source 312 provides light energy 312$a$ to optical assembly 320. Light energy 312$a$ is modified by optical assembly 320 (e.g., separating a beamlet of light to multiple beamlets, refracting/reflecting light beamlets, redirecting light energy, increasing/decreasing power, etc.) and exits optical assembly 320 as light energy 312$b$1, 312$b$2, and 312$b$3. Light energy 312$b$1, 312$b$2, and 312$b$3 is transmitted through carrier 102 (e.g., laser transmissive carrier) to reactive portion 106$a$ of transfer material 106. Referring now to FIG. 3C, gas 106$c$1, 106$c$2, and 106$c$3 is generated in transfer material 106 (e.g., in reactive portion 106$a$) from light energy 312$b$1, 312$b$2, and 312$b$3, respectively. Gas 106$c$1, 106$c$2, and 106$c$3 causes bubble 106$b$1$a$, 106$b$1$b$, and 106$b$1$c$ to be at least partially defined by die contact portion 106$b$. As gas 106$c$1, 106$c$2, and 106$c$3 is generated, corresponding bubbles 106$b$1$a$, 106$b$1$b$, and 106$b$1$c$ are formed (and expand) and die 104 is transferred from carrier 102 to receive substrate 108. As illustrated in FIG. 3C, first side 104$a$ remains in contact with bubble 106$b$1$a$, 106$b$1$b$, and 106$b$1$c$ while second side 104$b$ is in contact with die catch material 108$a$ of receive substrate 108. Referring now to FIG. 3D, die 104 is illustrated after a transfer process from carrier 102 to receive substrate 108 has been completed. Since the transfer of die 104 is now complete, light source 312 ceases transmitting light energy 312$a$, resulting in the reduction of the volume and/or size of bubble 106$b$1$a$, 106$b$1$b$, and 106$b$1$c$ illustrated in FIG. 3D.

Figure 4A:
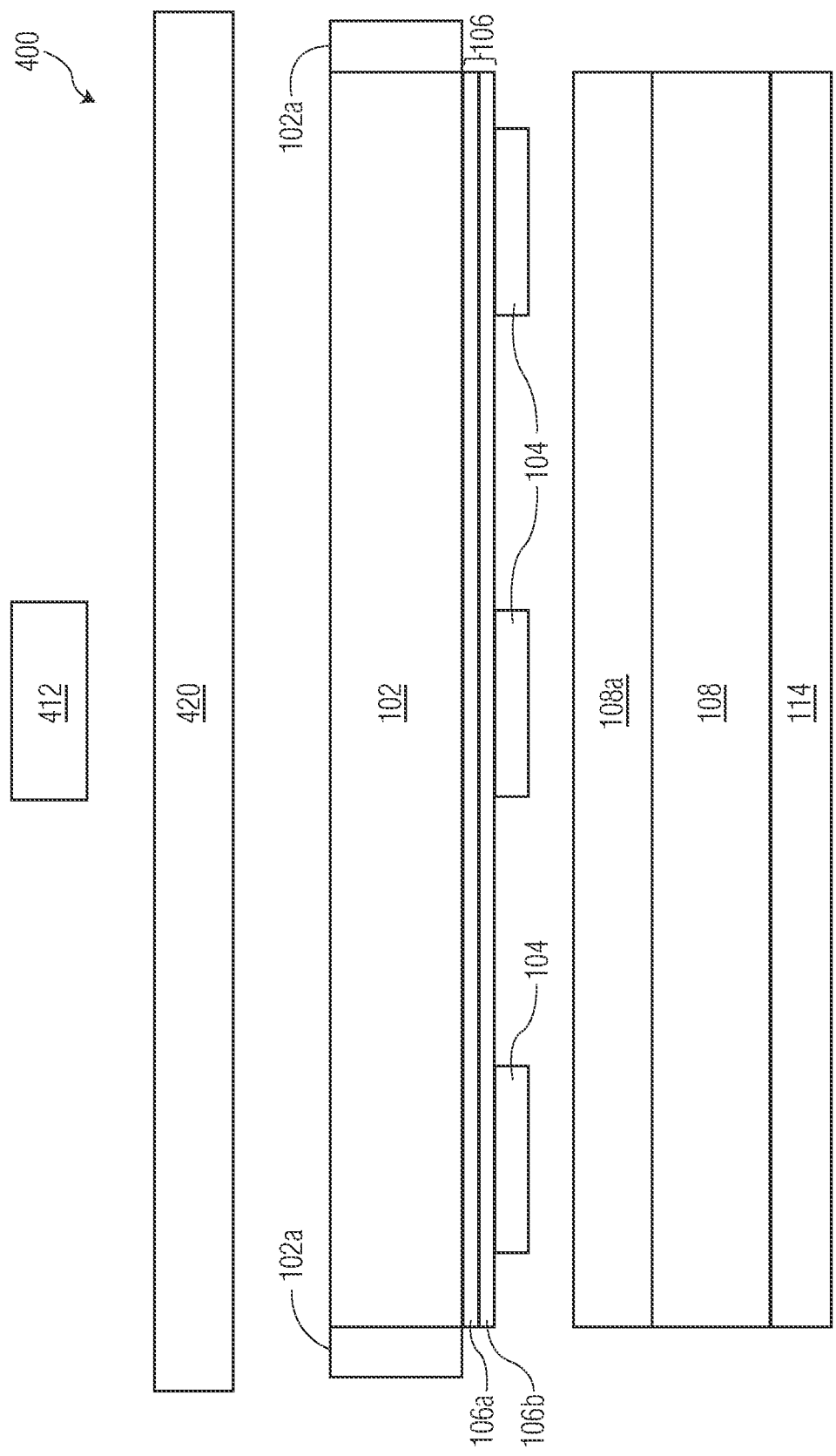
FIGS. 4A-4D are a series of block diagram side views of yet another transfer system illustrating yet another method of transferring of a plurality of die from a carrier to a receive substrate in accordance with an exemplary embodiment of the invention.

FIGS. 4A-4D illustrate the transfer of a plurality of die 104 from a carrier 102 to a receive substrate 108. Referring specifically to FIG. 4A, a transfer system 400 (similar to transfer system 100 of FIG. 1A, where like elements have the same reference numeral or a numeral beginning with "4" instead of "1") is illustrated. Transfer system 400 includes carrier 102 supported by a carrier support 102$a$ (e.g., a wafer ring or other type of carrier support); receive substrate 108 supported by support structure 114; a light source 412; and an optical assembly 420. The description of FIG. 1A in connection with transfer system 100 is applicable to transfer system 400 except light source 412 and optical assembly 420 are included in lieu of light source 112 and optical assembly 120. In the non-limiting example shown in FIG. 4A, light source 412 and optical assembly 420 are illustrated directly above carrier 102.

Figure 4B:
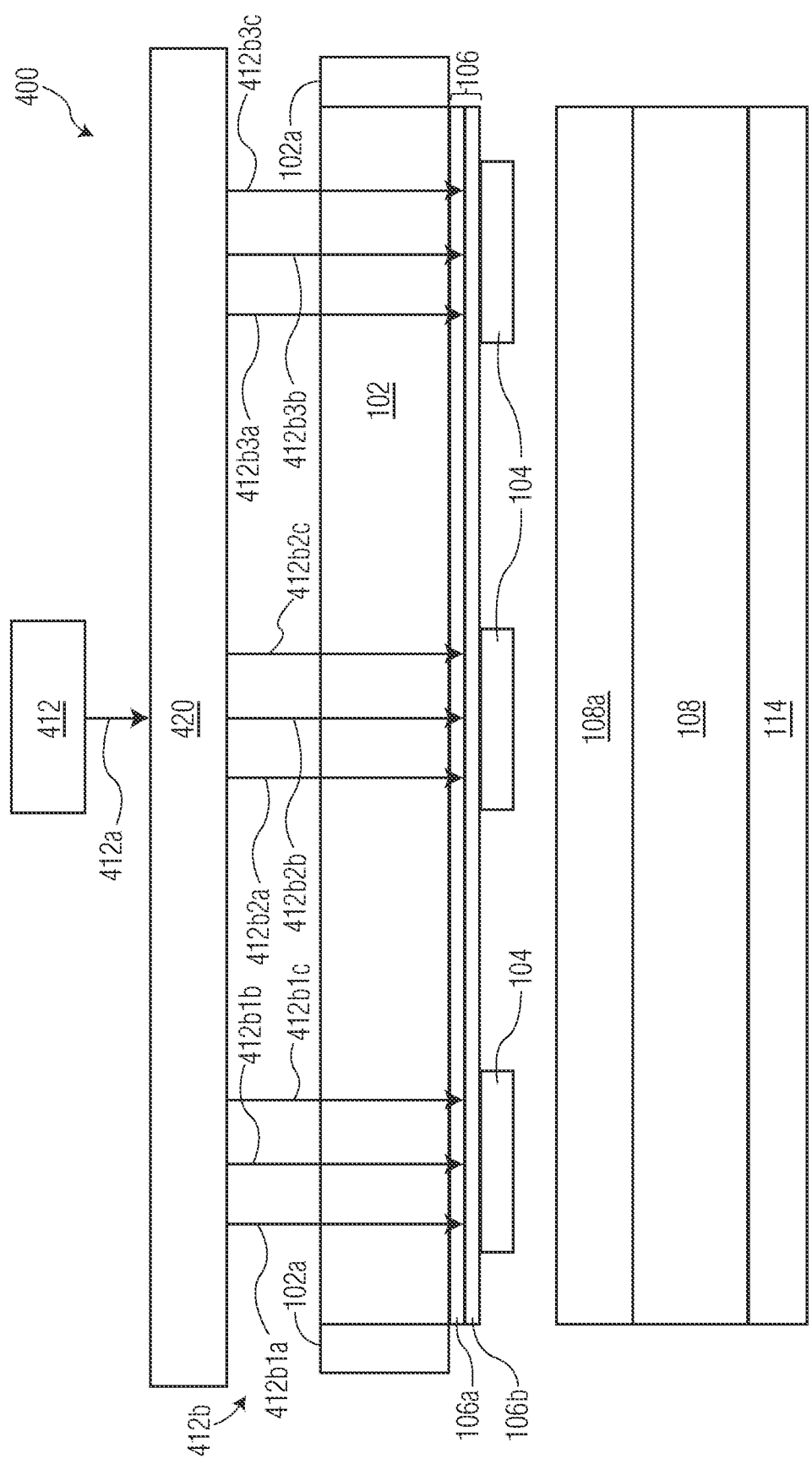
Figure 4C:
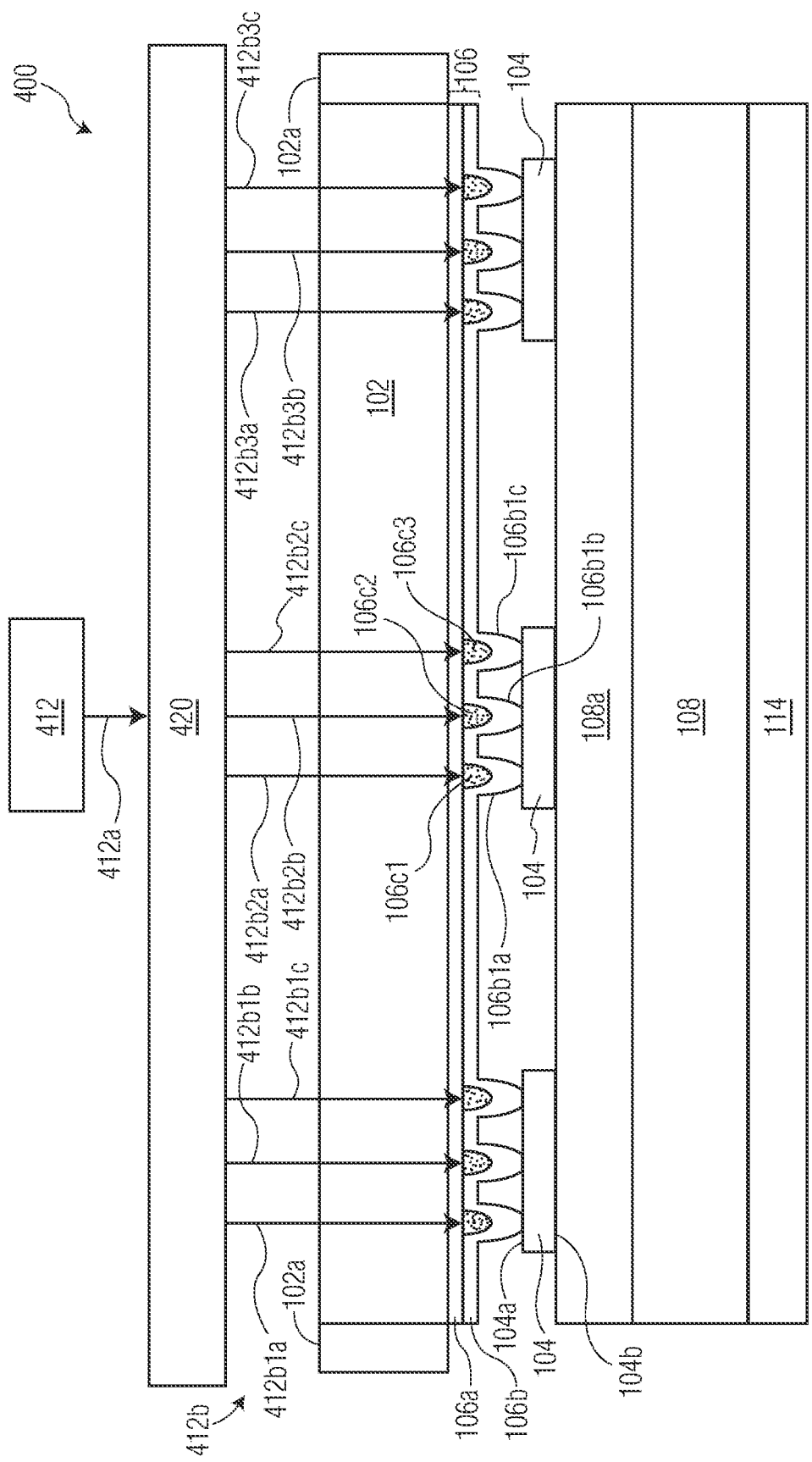
Figure 4D:
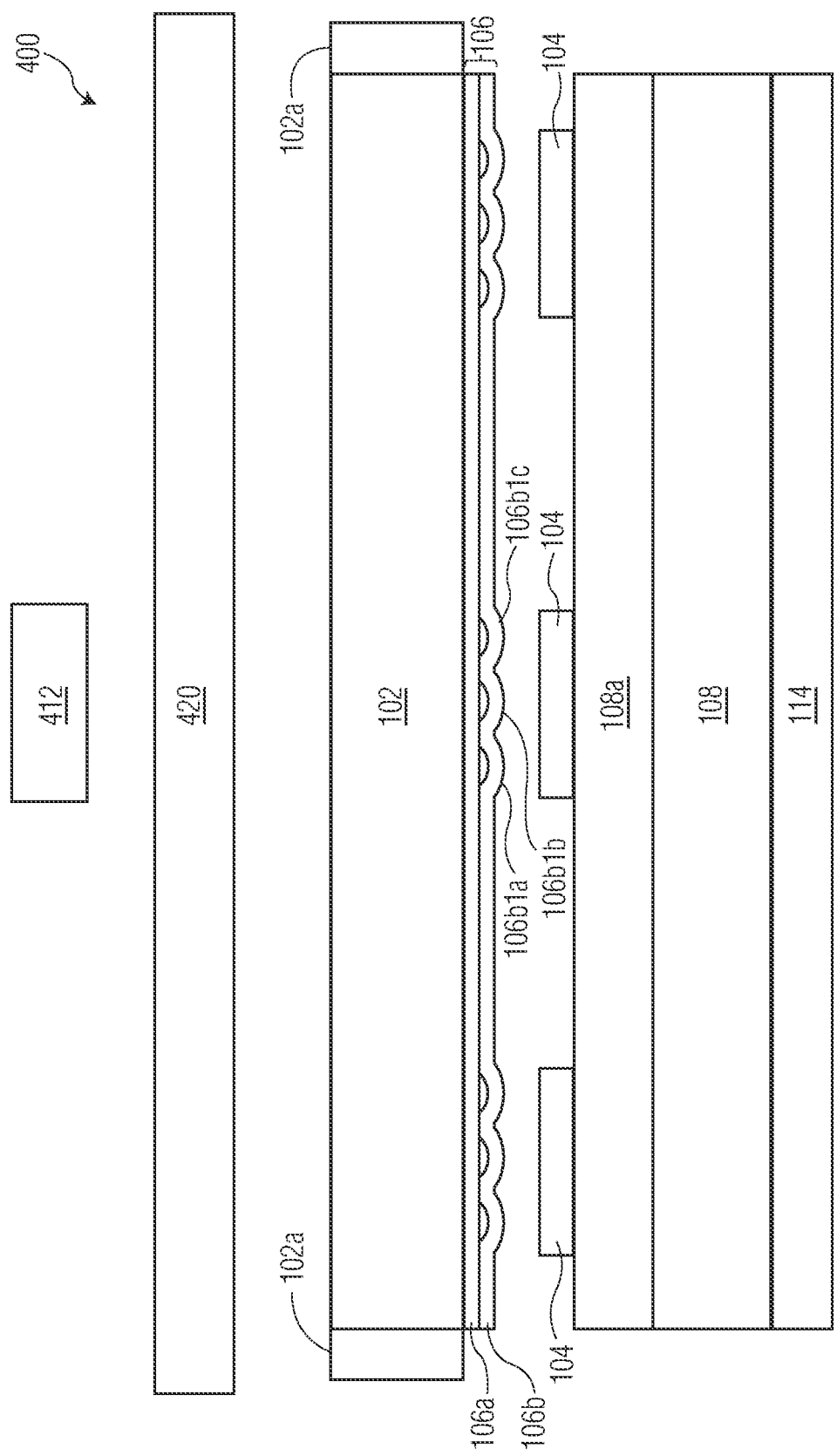

Thus, FIG. 4A illustrates carrier 102 (supporting a plurality of die 104) in a position spaced from receive substrate 108 prior to any transfer process (e.g., bubble transfer). From this position, the plurality of die 104 will be transferred from carrier 102 to receive substrate 108 as detailed in FIGS. 4B-4D. Referring specifically to FIG. 4B, light source 412 provides light energy 412a to optical assembly 420. Light energy 412a is modified by optical assembly 420 (e.g., separating a beamlet of light to multiple beamlets, refracting/reflecting light beamlets, redirecting light energy, increasing/decreasing power, etc.) and exits optical assembly 420 as light energy 412b1a, 412b1b, 412b1c, 412b2a, 412b2b, 412b2c, 412b3a, 412b3b, and 412b3c (collectively referred to herein as light energy 412b). Light energy 412b is transmitted through carrier 102 (e.g., laser transmissive carrier) to reactive portion 106a of transfer material 106. Referring now to FIG. 4C, gas 106c1, 106c2, and 106c3 is generated in transfer material 106 (e.g., in reactive portion 106a) from light energy 412b2a, 412b2b, and 412b2c, respectively. Gas 106c1, 106c2, and 106c3 causes bubbles 106b1a, 106b1b, and 106b1c to be at least partially defined by die contact portion 106b (see FIG. 4C). As gas is generated (e.g., gas 106c1, 106c2, and 106c3) and corresponding pluralities of bubbles (e.g., bubble 106b1a, 106b1b, and 106b1c) are formed (and expand), the plurality of die 104 are transferred from carrier 102 to receive substrate 108. As illustrated in FIG. 4C, first side 104a (of each of the plurality of die 104) remains in contact with the plurality of bubbles (e.g., bubble 106b1a, 106b1b, and 106b1c) while second side 104b (of each of the plurality of die 104) is in contact with die catch material 108a of receive substrate 108. Referring now to FIG. 4D, the plurality of die 104 are illustrated after a transfer process from carrier 102 to receive substrate 108 has been completed. Since the transfer of the plurality of die 104 is now complete, light source 412 ceases transmitting light energy 412a, resulting in the reduction of the volume and/or size of the plurality of bubbles (e.g., bubble 106b1a, 106b1b, and 106b1c) illustrated in FIG. 4D.

Although FIGS. 1A-1D, FIGS. 2A-2D, FIGS. 3A-3D, and FIGS. 4A-4D illustrate a die catch material 108a as covering the entire surface of receive substrate 108, embodiments of the invention are not so limited, as illustrated in FIGS. 5A-5D.

Figure 5C:
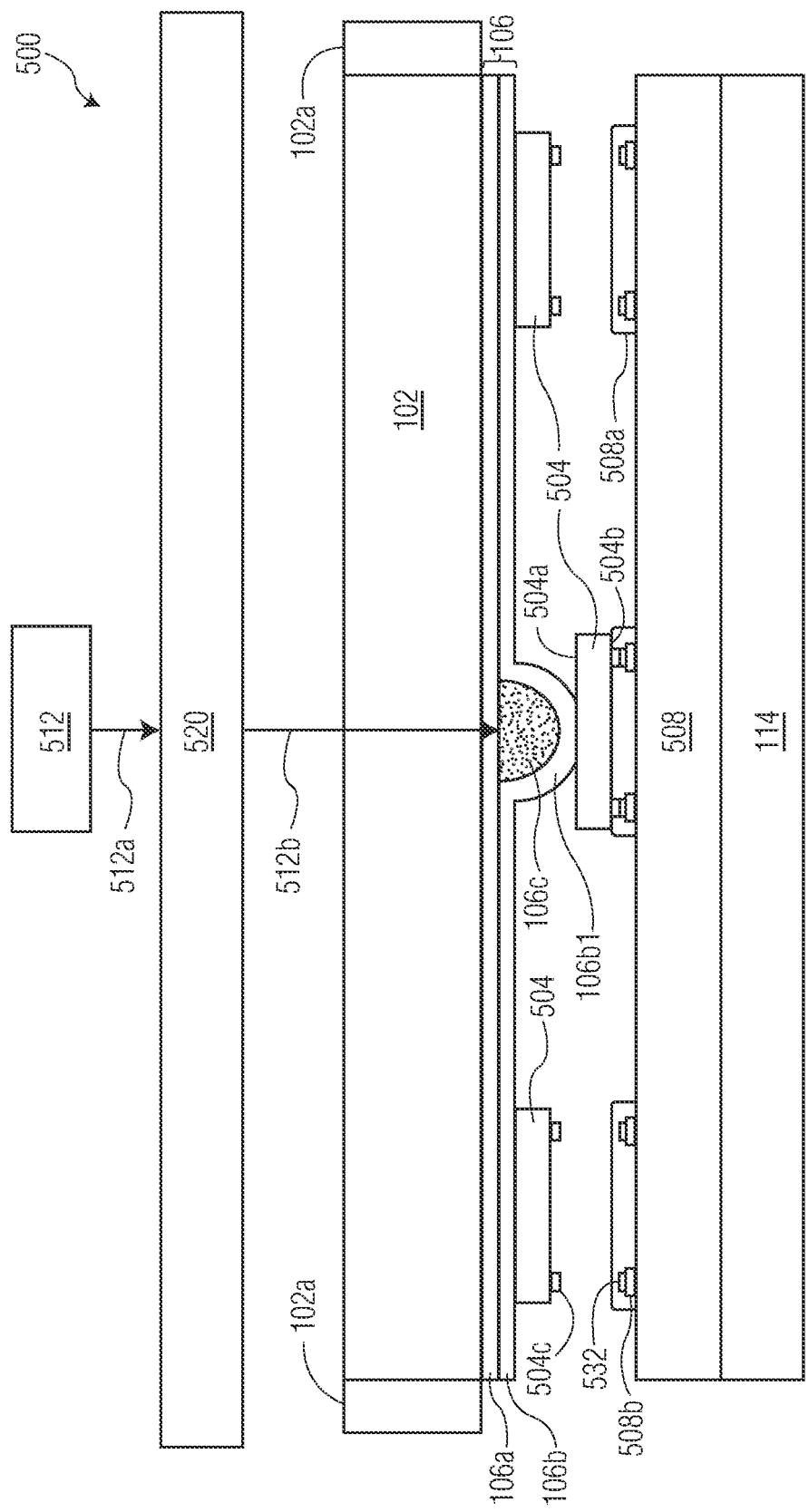

FIGS. 5A-5D illustrate the transfer of a die 504 from a carrier 102 to a receive substrate 508. Referring specifically to FIG. 5A, a transfer system 500 (similar to transfer system 100 of FIG. 1A, where like elements have the same reference numeral or a numeral beginning with "5" instead of "1") is illustrated. Transfer system 500 includes carrier 102 supported by a carrier support 102a (e.g., a wafer ring or other type of carrier support); receive substrate 508 supported by support structure 114; a light source 512; and an optical assembly 520. The description of FIG. 1A in connection with transfer system 100 is applicable to transfer system 500 in many ways except: light source 512 and optical assembly 520 replace light source 112 and optical assembly 120, respectively; a plurality of die 504 (each of which includes at least one die contact 504c) replaces the plurality of die 104; and a receive substrate 508 (and related features) is included in lieu of receive substrate 108. Receive substrate 508 includes a die catch material 508a which does not cover the entire die-facing surface of receive substrate 508 (in contrast to die catch material 108a of FIG. 1A).

Further, receive substrate 508 includes a plurality of receive substrate contacts 508b. Furthermore, solder paste 532 covers at least a portion of each of the plurality of receive substrate contacts 508b. In the non-limiting example shown in FIG. 5A, light source 512 and optical assembly 520 are illustrated directly above carrier 102.

Thus, FIG. 5A illustrates carrier 102 (supporting a plurality of die 504) in a position spaced from receive substrate 508 prior to any transfer process (e.g., bubble transfer). From this position, die 504 will be transferred from carrier 102 to receive substrate 508 as detailed in FIGS. 5B-5D. Referring specifically to FIG. 5B, light source 512 provides light energy 512a to optical assembly 520. Light energy 512a is modified by optical assembly 520 (e.g., separating a beamlet of light to multiple beamlets, refracting/reflecting light beamlets, increasing/decreasing power, etc.) and exits optical assembly 520 as light energy 512b. Light energy 512b is transmitted through carrier 102 (e.g., laser transmissive carrier) to reactive portion 106a of transfer material 106. Referring now to FIG. 5C, gas 106c is generated in transfer material 106 (e.g., in reactive portion 106a) from light energy 512b. Gas 106c causes bubble 106b1 to be at least partially defined by die contact portion 106b. As gas 106c is generated and bubble 106b1 is formed (and expands), die 504 is transferred from carrier 102 to receive substrate 508. As illustrated in FIG. 5C, first side 504a remains in contact with bubble 106b1 while second side 504b is in contact with die catch material 508a and/or while die contact 504c contacts (i.e., touches or connects to) receive substrate contact 508b through solder paste 532. Referring now to FIG. 5D, die 504 is illustrated after a transfer process from carrier 102 to receive substrate 508 has been completed. Since the transfer of die 504 is now complete, light source 512 ceases transmitting light energy 512a, resulting in the reduction of the volume and/or size of bubble 106b1 illustrated in FIG. 5D.

FIGS. 6A-6E illustrate the transfer of die 104 from carrier 102 to receive substrate 108. Referring specifically to FIG. 6A, a transfer system 600 (similar to transfer system 100 of FIG. 1A, where like elements have the same reference numeral or a numeral beginning with "6" instead of "1") is illustrated. Transfer system 600 includes carrier 102 supported by a carrier support 102a (e.g., a wafer ring or other type of carrier support); receive substrate 108 supported by support structure 114; a light source 612; and an optical assembly 620. The description of FIG. 1A in connection with transfer system 100 is applicable to transfer system 600 except: light source 612 and optical assembly 620 are included in lieu of light source 112 and optical assembly 120; and computer 650 (configured to provide instructions to control a pitch characteristic, a roll characteristic, or another physical characteristic, or combinations of such characteristics of die 104) is included. In the non-limiting example shown in FIG. 6A, light source 612 and optical assembly 620 are illustrated directly above carrier 102.

Thus, FIG. 6A illustrates carrier 102 (supporting a plurality of die 104) in a position spaced from receive substrate 108 prior to any transfer process (e.g., bubble transfer). From this position, die 104 will be transferred from carrier 102 to receive substrate 108 as detailed in FIGS. 6B-6E. Position P is illustrated directly below (and co-linear with) centerline CL of die 104 before die 104 starts to move. Referring specifically to FIG. 6B, light source 612 provides light energy 612a to optical assembly 620. Light energy 612a is modified by optical assembly 620 (e.g., separating a beamlet of light to multiple beamlets, refracting/reflecting light beamlets, redirecting light energy, increasing/decreasing power, etc.) and exits optical assembly 620 as light energy 612b. Light energy 612b is transmitted through carrier 102 (e.g., laser transmissive carrier) to reactive portion 106a of transfer material 106. Light energy 612b is directed to an area of reactive portion 106a which is offset from position P. Gas 106c is generated in transfer material 106 (e.g., in reactive portion 106a) from light energy 612b. Gas 106c causes bubble 106b1 to be at least partially defined by die contact portion 106b. As gas 106c is generated, bubble 106b1 is formed (and expands), thereby moving die 104 away from carrier 102. Bubble 106b1 grows (e.g., symmetrically, asymmetrically, or as otherwise desired) and causes die 104 to change orientation (in pitch, roll, yaw and/or another physical characteristic) and/or position, as illustrated by the position/orientation of centerline CL of die 104 with respect to position P. Referring now to FIG. 6C, as bubble 106b1 continues to expand, first side 104a of die 104 continues to remain in contact with bubble 106b1 while a portion of second side 104b of die 104 is in contact with die catch material 108a of receive substrate 108. Referring now to FIG. 6D, bubble 106b1 continues to expand at least until second side 104b of die 104 makes sufficient contact with die catch material 108a to transfer die 104. Computer 650, in connection with light source 612 and/or optical assembly 620, may be used to control various transfer parameters (e.g., laser transfer parameters via light source 612 such as optical intensity of energy from light source 612, xy location of optical energy from light source 612 on die 104, size and/or shape of optical energy from light source on die 104, etc.). Such parameters may be used to affect characteristics such as a placement force of die 104, a velocity of die 104 at impact, a pitch characteristic of die 104, a roll characteristic of die 104, etc. Referring now to FIG. 6E, die 104 is illustrated after a transfer process from carrier 102 to receive substrate 108 has been completed. Since the transfer of die 104 is now complete, light source 612 ceases transmitting light energy 612a, resulting in the reduction of the volume and/or size of bubble 106b1 illustrated in FIG. 6E.

As will be appreciated by those skilled in the art, techniques such as that shown in FIGS. 6A-6E (e.g., changing orientation and/or position of die 104, such that the centerline CL of die 104 shifts with respect to position P die transfer location) may be utilized for a number of reasons. For example, accuracy of die 104 on carrier 120 may be inaccurate (e.g., as determined using an offline camera, an online camera, etc.). Techniques such as that shown in FIGS. 6A-6E may be used to overcome such inaccuracy.

While FIGS. 5A-5D and FIGS. 6A-6E illustrate transfer of a single die 504 (or 104) using a single beam of light energy 512b (or 612b), it is not limited thereto. For example, the teachings of (i) FIGS. 2A-2D and FIGS. 4A-4D (both illustrating transfer of more than one die simultaneously) and (ii) FIGS. 3A-3D and FIGS. 4A-4D (both illustrating using more than one beam of light energy to transfer a single die) are applicable to the applications shown in connection with transfer systems 500, 600 in FIGS. 5A-5D and FIGS. 6A-6E.

Various features of FIGS. 6A-6E are applicable to the various other embodiments of the invention disclosed herein. For example, inclusion of a computer 650 to control light energy from a light energy source (thereby controlling certain parameters, such as laser transfer parameters) may be applied to other embodiments illustrated herein, or within the scope of the invention. In another example, controlling a physical characteristic (e.g., a pitch characteristic of die 104, a roll characteristic of die 104, etc.) may also be applied to other embodiments illustrated herein, or within the scope of the invention.

While FIGS. 6A-6E illustrate an exemplary technique for controlling a physical characteristic of a die (e.g., a pitch characteristic of die 104, a roll characteristic of die 104, both, other physical characteristics, etc.), it is understood that this is just one example. Thus, it is understood that other techniques for controlling a physical characteristic of a die are contemplated within the scope of the invention.

It will be understood that transfer material 106 is not limited to include merely reactive portion 106a and die contact portion 106b (e.g., such as a wafer tape). Transfer material 106 may include any configuration as desired in a given application.

FIG. 7 is a flow diagram in accordance with certain exemplary embodiments of the invention. As is understood by those skilled in the art, certain steps included in the flow diagram may be omitted; certain additional steps may be added; and the order of the steps may be altered from the order illustrated.

FIG. 7 illustrates a method of transferring a die from a carrier to a receive substrate (e.g., see the methods shown in FIGS. 1A-1D, FIGS. 2A-2D, FIGS. 3A-3D, FIGS. 4A-4D, FIGS. 5A-5D, and FIGS. 6A-6E). At step 700, a die is supported on a carrier, where a transfer material is provided between the die and the carrier. At Step 702, the transfer material is exposed to light energy to form a bubble in the transfer material. At Step 704, the die is transferred from the carrier to a receive substrate using the bubble, the die being in contact with the bubble when the die contacts the receive substrate. At optional Step 706, a pitch characteristic of the die is controlled in connection with the transfer from the carrier to the receive substrate in Step 704 (see, e.g., FIGS. 6B-6E). At optional Step 708, a roll characteristic of the die is controlled in connection with the transfer from the carrier to the receive substrate in Step 704 (also, see, e.g., FIGS. 6B-6E).

Although the invention is illustrated and described primarily with respect to a single light source and optical assembly, the invention is not limited thereto. It is understood that aspects of the invention may utilize a plurality of light sources and/or optical assemblies.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A method of transferring a die from a carrier to a receive substrate, the method comprising the steps of:
   (a) supporting a die on a carrier, a transfer material being provided between the die and the carrier;
   (b) exposing the transfer material to light energy to form a bubble in the transfer material; and
   (c) transferring the die from the carrier to a receive substrate using the bubble, the die being in contact with the bubble when the die contacts the receive substrate, wherein the receive substrate includes a die catch material, the die catch material being a material used to receive the die during the transferring, wherein during step (c) a first side of the die is in contact with the bubble when a second side of the die contacts the receive substrate, wherein the light energy is directed to an area of the transfer material which is offset from a centerline of the die such that an orientation of the die changes as the bubble grows.

2. The method of claim 1 wherein a plurality of the die are supported on the carrier.

3. The method of claim 2 wherein step (c) includes transferring the plurality of die simultaneously.

4. The method of claim 2 wherein step (c) includes transferring the plurality of die one at a time.

5. The method of claim 1 wherein the transfer material includes a wafer tape, the bubble being at least partially defined by the wafer tape during step (b).

6. The method of claim 1 wherein the die catch material includes a base layer, an energy absorbing layer, and an adhesive layer.

7. The method of claim 1 further comprising the step of controlling a pitch characteristic of the die in connection with the transfer from the carrier to the receive substrate in step (c), wherein the bubble expands to cause the die to change orientation in pitch such that the first side of the die continues to remain in contact with the bubble while a portion of the second side of the die is in contact with the die catch material of the receive substrate, wherein the bubble continues to expand at least until the second side of the die makes sufficient contact with the die catch material to transfer the die.

8. The method of claim 1 wherein the transfer material includes a base layer, a laser absorption layer, a bubble layer, and an adhesive layer.

9. The method of claim 1 further comprising the step of controlling a roll characteristic and a pitch characteristic of the die in connection with the transfer from the carrier to the receive substrate in step (c).

10. A system for transferring a die from a carrier to a receive substrate, the system comprising:
   a carrier for supporting a die;
   a transfer material being disposed between the die and the carrier while the die is being supported by the carrier;
   a receive substrate configured to receive the die from the carrier, wherein the receive substrate includes a die catch material, the die catch material being a material used to receive the die during transfer; and
   a light source for providing light energy to the transfer material to cause a bubble to form in the transfer material, the die being transferred from the carrier to the receive substrate using the bubble, the die being in contact with the bubble when the die contacts the receive substrate, wherein a first side of the die is in contact with the bubble when a second side of the die contacts the receive substrate, wherein the light source is configured to provide the light energy directed to an area of the transfer material which is offset from a centerline of the die such that an orientation of the die changes as the bubble grows.

11. The system of claim 10 including a plurality of the die supported on the carrier, the system being configured to transfer the plurality of die simultaneously.

12. The system of claim 10 including a plurality of the die supported on the carrier, the system being configured to transfer the plurality of die one at a time.

13. The system of claim 10 wherein the transfer material includes a wafer tape, the bubble being at least partially defined by the wafer tape.

14. The system of claim 10 wherein the carrier is a laser transmissive carrier.

15. The system of claim 10 wherein the carrier is a flexible freestanding carrier.

16. The system of claim 10 wherein the die catch material includes a base layer, an energy absorbing layer, and an adhesive layer.

17. The system of claim 10 further comprising a computer configured to provide instructions to control a pitch characteristic of the die in connection with the transfer from the carrier to the receive substrate, wherein the bubble expands to cause the die to change orientation in pitch such that the first side of the die continues to remain in contact with the bubble while a portion of the second side of the die is in contact with the die catch material of the receive substrate, wherein the bubble continues to expand at least until the second side of the die makes sufficient contact with the die catch material to transfer the die.

18. The system of claim 10 wherein the die transfer material includes a base layer, a laser absorption layer, a bubble layer, and an adhesive layer.

19. The system of claim 10 further comprising a computer configured to provide instructions to control a pitch characteristic and a roll characteristic of the die in connection with the transfer from the carrier to the receive substrate.

20. A method of transferring a die from a carrier to a receive substrate, the method comprising the steps of:
   (a) supporting a die on a carrier, a transfer material being provided between the die and the carrier;
   (b) exposing the transfer material to light energy to form a bubble in the transfer material; and
   (c) transferring the die from the carrier to a receive substrate using the bubble, the die being in contact with the bubble when the die contacts the receive substrate, wherein the receive substrate includes a die catch material, the die catch material being a material used to receive the die during the transferring,
   the method including controlling a pitch characteristic of the die in connection with the transfer from the carrier to the receive substrate in step (c), wherein the bubble expands to cause the die to change orientation in pitch such that a first side of the die continues to remain in contact with the bubble while a portion of a second side of the die is in contact with the die catch material of the receive substrate, wherein the bubble continues to expand at least until the second side of the die makes sufficient contact with the die catch material to transfer the die.

21. The method of claim 20 wherein a plurality of the die are supported on the carrier, wherein step (c) includes transferring the plurality of die simultaneously.

22. The method of claim 20 wherein a plurality of the die are supported on the carrier, wherein step (c) includes transferring the plurality of die one at a time.

23. A system for transferring a die from a carrier to a receive substrate, the system comprising:
   a carrier for supporting a die;
   a transfer material being disposed between the die and the carrier while the die is being supported by the carrier;
   a receive substrate configured to receive the die from the carrier, wherein the receive substrate includes a die catch material, the die catch material being a material used to receive the die during transfer;
   a light source for providing light energy to the transfer material to cause a bubble to form in the transfer material, the die being transferred from the carrier to the receive substrate using the bubble, the die being in contact with the bubble when the die contacts the receive substrate; and
   a computer configured to provide instructions to control a pitch characteristic of the die in connection with the transfer from the carrier to the receive substrate, wherein the bubble expands to cause the die to change orientation in pitch such that a first side of the die continues to remain in contact with the bubble while a portion of a second side of the die is in contact with the die catch material of the receive substrate, wherein the bubble continues to expand at least until the second side of the die makes sufficient contact with the die catch material to transfer the die.

* * * * *